United States Patent
Collins et al.

(10) Patent No.: US 8,789,761 B2
(45) Date of Patent: Jul. 29, 2014

(54) TRANSACTION CARD

(71) Applicant: Intelligent Material Solutions, Inc., Princeton, NJ (US)

(72) Inventors: Joshua E. Collins, Philadelphia, PA (US); Howard Y. Bell, Princeton, NJ (US)

(73) Assignee: Intelligent Material Solutions, Inc., Princeton, NJ (US)

( * ) Notice: Subject to any disclaimer, the term of this patent is extended or adjusted under 35 U.S.C. 154(b) by 0 days.

(21) Appl. No.: 13/646,191

(22) Filed: Oct. 5, 2012

(65) Prior Publication Data

US 2013/0087622 A1    Apr. 11, 2013

Related U.S. Application Data

(60) Provisional application No. 61/544,882, filed on Oct. 7, 2011.

(51) Int. Cl.
| | | |
|---|---|---|
| G06K 19/00 | (2006.01) | |
| G06K 19/02 | (2006.01) | |
| G06K 19/06 | (2006.01) | |

(52) U.S. Cl.
USPC ...... 235/491; 235/487; 235/488; 252/301.16; 252/301.36; 252/301.4 F; 252/301.4 R; 252/301.5; 252/301.6 F; 252/301.6 R

(58) Field of Classification Search
CPC ............... G06K 19/02; B42D 2033/10; B42D 2033/20; B42D 2035/38; H01F 10/32; Y10S 977/773

USPC ........ 235/487, 488, 491; 252/301.16–301.36, 252/301.4 F–301.4 R, 301.5, 301.6 F–301.6 R

See application file for complete search history.

(56) References Cited

U.S. PATENT DOCUMENTS

| | | | |
|---|---|---|---|
| 2004/0124245 A1* | 7/2004 | Kiekhaefer | 235/487 |
| 2006/0084278 A1* | 4/2006 | Winter et al. | 438/777 |
| 2009/0121189 A1* | 5/2009 | Ju et al. | 252/301.6 R |
| 2010/0025475 A1* | 2/2010 | Webb et al. | 235/488 |
| 2010/0059691 A1* | 3/2010 | Lewis et al. | 250/473.1 |

OTHER PUBLICATIONS

Guang-Shun Yi and Gan-Moog Chow, "Rare-earth Doped LaF3 Nanocrystals for Upconversion Fluorescence," (Oct. 2005), retrieved from http://dspace.mit.edu/bitstream/handle/1721.1/30391/MEBCS014.pdf?sequence=1 on Jun. 20, 2013.*

* cited by examiner

*Primary Examiner* — Christle I Marshall
*Assistant Examiner* — Claude J Brown
(74) *Attorney, Agent, or Firm* — J.A. Lindeman & Co., PLLC

(57) ABSTRACT

This invention relates to a transparent or translucent transaction card having a base comprising a core of substantially transparent or translucent material with a plurality of coats, including optically recognizable ink comprising one or more infrared blocking dyes and other nanoparticles, such as rare earth nanophosphors and other metal nanoparticles, and/or optically recognizable film comprising nanoparticles, such as rare earth nanophosphors, and other metal oxide and/or non-oxide complexes, and methods for their preparation.

18 Claims, 11 Drawing Sheets

FIG. 2

| 1.8 | Clear PVC Over Laminate |
|---|---|

| 9 | Clear Front PVC Core |
|---|---|
|   | 0.25 IR Block Ink: A |

| 0.75 | Printed Adhesive: A |
|---|---|

| 1.5 | Inlay |
|---|---|

| 0.75 | Printed Adhesive: A | Chip |
|---|---|---|
|   | 0.25 IR Block Ink: B |   |
| 9 | PVC | Hole |
|   | 0.25 IR Block Ink: C |   |

| 5 | Clear Back PVC |
|---|---|

| 1.8 | Clear PVC Over Laminate |
|---|---|

Total Thickness: 30.35 MIL

FIG. 3

TRANSACTION CARD

TECHNICAL FIELD OF THE INVENTION

The invention relates generally to transaction cards, and more particularly, to the fabrication and use of optically recognizable transparent or translucent transaction cards that may contain a hologram, magnetic stripe, or integrated circuit as well as other transaction card constituents, which may be detected by currently available card printing machines, automatic teller machines, and other card readers.

BACKGROUND OF THE INVENTION

The proliferation of transaction cards, which allow the cardholder to pay with credit rather than cash, started in the United States in the early 1950s. Initial transaction cards were typically restricted to select restaurants and hotels and were often limited to an exclusive class of individuals. Since the introduction of plastic credit cards, the use of transaction cards have rapidly proliferated from the United States, to Europe, and then to the rest of the world. Transaction cards are not only information carriers, but also typically allow a consumer to pay for goods and services without the need to constantly possess cash, or if a consumer needs cash, transaction cards allow access to funds through an automatic teller machine (ATM). Transaction cards also reduce the exposure to the risk of cash loss through theft and reduce the need for currency exchanges when traveling to foreign countries. Due to the advantages of transaction cards, hundreds of millions of cards are now produced and issued annually, thereby resulting in need for companies to differentiate their cards from competitor's cards.

Initially, the transaction cards often included the issuer's name, the cardholder's name, the card number, and the expiration date embossed onto the card for, among other things, creating an imprint on credit card transaction forms. The cards also usually included a signature field on the back of the card for the cardholder to provide a signature to protect against forgery and tempering. Thus, the initial cards merely served as devices to provide data to merchants and the only security associated with the card was the comparison of the cardholder's signature on the card to the cardholder's signature on a receipt along with the embossed cardholder name on the card. However, many merchants often forget to verify the signature on the receipt with the signature on the card.

Due to the popularity of transaction cards, numerous companies, banks, airlines, trade groups, sporting teams, clubs, and other organizations have developed their own transaction cards. As such, many companies continually attempt to differentiate their transaction cards and increase market share not only by offering more attractive financing rates and low initiation fees, but also by offering unique, aesthetically pleasing features on the transaction cards. As such, many transaction cards included not only demographic and account information, but the transaction cards also include graphic images, designs, photographs and security features.

Administrative and security issues, such as charges, credits, merchant settlement, fraud, reimbursements, etc., have increased due to the increasing use of transaction cards. Thus, the transaction card industry started to develop more sophisticated transaction cards which allowed the electronic reading, transmission, and authorization of transaction card data for a variety of industries. For example, magnetic stripe cards, optical cards, smart cards, calling cards, and supersmart cards have been developed to meet the market demand for expanded features, functionality, and security. In addition to the visual data, the incorporation of a magnetic stripe on the back of a transaction card allows digitized data to be stored in machine readable form. As such, magnetic stripe reader are used in conjunction with magnetic stripe cards to communicate purchase data received from a cash register device on-line to a host computer along with the transmission of data stored in the magnetic stripe, such as account information (e.g., entity issuing the card and/or the person to whom the card is issued) and expiration date.

Due to the susceptibility of the magnetic stripe to tampering, the lack of confidentiality of the information within the magnetic stripe and the problems associated with the transmission of data to a host computer, integrated circuits were developed which could be incorporated into transaction cards. These integrated circuit (IC) cards, known as smart cards, proved to be very reliable in a variety of industries due to their advanced security and flexibility for future applications.

As magnetic stripe cards and smart cards developed, the market demanded international standards for the cards. The card's physical dimensions, features and embossing area were standardized under the International Standards Organization ("ISO"), ISO 7810 and ISO 7811. The issuer's identification, the location of particular compounds, coding requirements, and recording techniques were standardized in ISO 7812 and ISO 7813, while chip card standards were established in ISO 7813. For example, ISO 7811 defines the standards for the magnetic stripe which is a 0.5 inch stripe located either in the front or rear surface of the card which is divided into three longitudinal parallel tracks. The first and second tracks hold read-only information with room for 79 alpha numeric characters and 40 numeric characters, respectively. The third track is reserved for financial transactions and includes enciphered versions of the user's personal identification number, country code, currency units, amount authorized per cycle, subsidiary accounts, and restrictions. More information regarding the features and specifications of transaction cards can be found in, for example, Smart Cards by Jose Luis Zoreda and Jose Manuel Oton, 1994; Smart Card Handbook by W. Rankl and W. Effing, 1997, and the various ISO standards for transaction cards available from ANSI (American National Standards Institute), 11 West 42nd Street, New York, N.Y. 10036, the disclosures of which are incorporated herein by reference.

The incorporation of machine-readable components onto transactions cards encouraged the proliferation of devices to simplify transactions by automatically reading from and/or writing onto transaction cards. Such devices include, for example, bar code scanners, magnetic stripe readers, point of sale terminals (POS), automated teller machines (ATM) and card-key devices. With respect to ATMs, the total number of ATM devices shipped in 1999 is 179,274 (based on Nilson Reports data) including the ATMs shipped by the top ATM manufacturers, namely NCR (138-18 231st Street, Laurelton, N.Y. 11413), Diebold (5995 Mayfair, North Canton, Ohio 44720-8077), Fujitsu (11085 N. Torrey Pines Road, La Jolla, Calif. 92037), Omron (Japan), OKI (Japan) and Triton.

Many of the card acceptance devices require that the transaction card be inserted into the device such that the device can appropriately align its reading head with the relevant component of the transaction card. Particularly, many ATMs require that a transaction card be substantially inserted into a slot in the ATM. After insertion of the card into the slot, the ATM may have an additional mechanical device for further retracting the transaction card into the ATM slot. To activate the ATM, the ATM typically includes a sensor, such as a phototransistor and a light emitting diode (LED), which emits light onto a card surface and the phototransistor receives light from the LED. A card blocks the infrared radiation from the phototransistor, therefore indicating that a card has been detected. A typical LED in an ATM is an IRED (infrared emitting diode) source having a wavelength in the range of about 820-920 nm or 900-1000 nm, which is not present in ambient light at the levels needed by a phototransistor sensor. The spectral sensitivity curve of the typical phototransistor is in the range of about 400-1100 nm. However, the visible spectrum is about 400-700 nm, and the spectral sensitivity of the phototransistor is about 60% at 950 nm and 90% at 840 nm. Thus, visible light is not part of the analog-to-digital algorithm. Moreover, ISO 7810, clause 8.10 requires that all machine readable cards have an optical transmission density from 450-950 nm, greater than 1.3 (less than 5% transmission) and from 950-1000 nm, greater than 1.1 (less than 7.9% transmission).

For the card to be detected by the ATM, the light is typically blocked by the card body. Moreover, the amount of light necessary to be blocked by a card is related to the voltage data received from the analog to digital conversion. The voltage range of the sensor is typically in a range of about 1.5 V to 4.5 V. When a card is inserted into a sensor, the voltage drops to less than 1.5 V indicating the presence of a card in the transport system. After the card is detected by the phototransistor, the magnetic stripe reader scans the magnetic stripe and acquires the information recorded on the magnetic stripe. A manufacturer of the LED sensor device in an ATM is, for example, Omron and Sankyo-Seiki of Japan, 4800 Great America Parkway, Suite 201, Santa Clara, Calif. 95054.

As previously mentioned, transaction cards and readers typically follow various ISO standards which specifically set forth the location of card data and compounds. However, because numerous companies produce different versions of ATMs, the location of the sensor within the ATM is not subject to standardization requirements. In the past, the varying locations of the sensor within the ATM did not affect the ability of the ATM to sense the transaction card because the transaction card included a substantially opaque surface, such that any portion of the opaque transaction card could interrupt the IRED emission and activate the insert phototransistor. However, more recently, to provide a unique image, and to meet consumer demand, companies have attempted to develop transparent or translucent transaction cards. The use of a transparent card would often not activate the insert phototransistor because the IRED emission would not sufficiently reflect off of a transparent surface, so the radiation would simply travel through the card and become detected by the phototransistor. The machine, therefore, could not detect the presence of the card, and often jammed the equipment.

In an attempt to solve this problem, companies have printed opaque areas onto transparent cards in an effort to provide an opaque area to activate the input sensors on ATMs. However, due to the aforementioned variations in the location of the sensor in many ATMs, the use of limited opaque areas on a transparent card did not allow the card to activate the sensor in a sufficient number of ATMs. Alternatively, companies attempted to incorporate a lens onto a transaction card in an effort to redirect the LED light. However, during the card manufacture process, which often involves substantial pressure and heat, the lensing surface would be disrupted or destroyed. As such, a need exists for a transparent or translucent transaction card which is capable of activating an input sensor, wherein the input sensor may interface the card in a variety of locations.

Furthermore, during the card fabrication process, the cards must be detected on the assembly line in order to accurately count the number of cards produced during a predetermined time interval. To count the cards, typical card fabrication assembly lines include counters with LED sensors, similar to the ATM sensors, which count the cards based upon the reflection of the LED light beam off of the opaque card surface. The production of transparent transaction cards suffers from similar limitations as ATM devices in that the LED beam does not reflect or is not sufficiently absorbed from a transparent surface. Thus, a transparent card is needed that can be produced on existing assembly lines. Similar problems exist when cards are punched to final dimensions.

Although existing systems may allow for the identification and detection of articles, most contain a number of drawbacks. For example, identification features based on UV, visible light detection, etc. are sometimes difficult to view, often require certain lighting requirements and typically depend on the distance between the article and the detection device. Additionally, the use of certain types of plastic, paper or other material which contain the identification mark may be limited by the particular identification device. For example, opaque materials typically deactivate the phototransistors in ATM's by blocking light in both the visible (near IR) and far IR light regions. Furthermore, the incorporation of a detection or authentication feature into a card product requires a separate material or process step during the card fabrication process. The incorporation of a new material or process step often requires expensive modifications to current equipment or new equipment and often extends the time for fabricating the card product.

BRIEF SUMMARY OF THE INVENTION

The present invention relates to a transparent (i.e., possessing at least 97% transparency in the visible region of the electromagnetic spectrum) or translucent transaction card having a base comprising a core of substantially transparent or translucent material with a plurality of coats, and any one or more features, such as a holographic foil, integrated circuit chip, silver magnetic stripe with text on the magnetic stripe, opacity gradient, an optically recognizable ink (comprising one or more infrared blocking (i.e., absorbing, refracting, diffusing, reflecting, or otherwise blocking) dyes and other nanoparticles (e.g., rare earth (RE) nanophosphors and other metal nanoparticles) and/or film (comprising nanoparticles, such as RE nanophosphors, and other metal oxide and/or non-oxide complexes, sputtered on a substrate, such as a polyethylene (PET) substrate) contained within the construction of the card, a substantially translucent signature field such that the signature on back of the card is visible from the front of the card, and an "active thru" date on the front of the card. The card is optically recognizable due to an invisible or visibly transparent infrared blocking ink and/or film, which is distributed over the card's surface and/or within the body of the card, thereby allowing the card to block infrared light and transmit all other light (e.g., humanly visible light). Particularly, when the transaction card is inserted into an ATM device, the light beam from the IRED is blocked by the infrared blocking ink, film, or combination of both, thereby deactivating the phototransistor. Moreover, during the manufacturer of transaction cards, the optically recognizable card allows an IRED light beam from a personalization device, inspection unit, or counter device to count the number of transaction cards produced in an assembly line.

The invention also relates to a method for manufacturing such transparent or translucent transaction cards. The method includes the steps of forming a core of transparent plastic and applying a plurality of coats of infrared blocking inks and/or films to at least one surface of the core, which infrared blocking inks and/or films are transparent to non-IRED light (e.g., humanly visible light) and which is opaque to IRED light.

BRIEF DESCRIPTION OF THE DRAWINGS

The following figures, which are described below and which are incorporated in and constitute a part of the specification, illustrate exemplary embodiments according to the invention and are not to be considered limiting of the scope of the invention, for the invention may admit to other equally effective embodiments. The figures are not necessarily to scale, and certain features and certain views of the figures may be shown exaggerated in scale or in schematic in the interest of clarity and conciseness.

FIG. 2 shows exemplary RE dopants and their NIR transitions.

FIG. 3 illustrates a cross-section of a transaction card of the invention.

DETAILED DESCRIPTION

Figure 1:
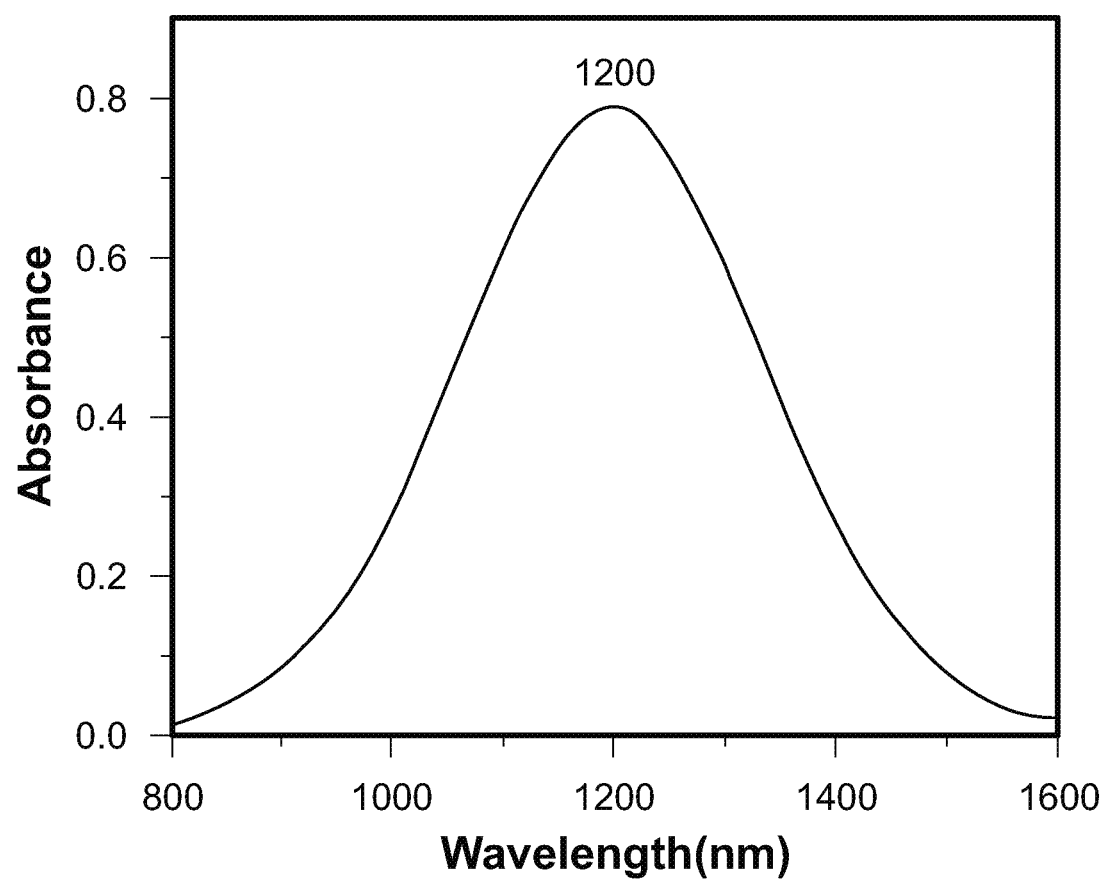
FIG. 1 shows the NIR absorption spectra of RE-doped nanophosphors.

In general, the present invention allows for the identification and detection of various articles, wherein the articles include materials having optically recognizable (i.e., infrared) inks and/or films. The articles include, for example, transaction cards, documents, papers and/or the like. The materials include, for example, coatings, films, threads, plastics, inks, fibers, paper, planchettes, and/or the like.

In an exemplary embodiment, the optically recognizable inks contain near-infrared blocking (i.e., absorbing, refracting, diffusing, reflecting, or otherwise blocking) ingredients, including infrared dyes and absorbers, and nanoparticles (e.g., RE nanophosphors and other metal nanoparticles). In another exemplary embodiment, the optically recognizable films contain infrared blocking (i.e., absorbing, refracting, diffusing, reflecting, or otherwise blocking) ingredients, including nanoparticles, such as RE nanophosphors and other metal oxide and/or non-oxide complexes, which are, for example, sputtered on a substrate, such as a PET substrate. The optically recognizable inks and films may be invisible, visible, or colored to produce a desired effect and/or they may contain other detectable compounds, such as, for example, UV-Fluorescent or IR-Fluorescent and/or phosphorescent features. The optically recognizable inks and films preferably have good stability, resistance properties, durability, and other physical properties, such as good appearance, flexibility, hardness, solvent resistance, water resistance, corrosion resistance, and exterior stability. Moreover, the use of such inks and films typically does not interfere with UV compounds that may be present in many substrates. The optically recognizable ink comprises any dye, absorber, and/or the like, and RE nanophosphors, the combination of which is recognizable by a sensor. In an exemplary embodiment, the optically recognizable ink is an infrared dye and/or absorber, and RE nanophosphor, which blocks, absorbs, diffuses, refracts, or reflects most infrared light, but transmits most other wavelengths of light. The optically recognizable film comprises nanoparticles, such as the same or different RE nanophosphors and one or more metal oxide and non-oxide complexes, the combination of which is recognizable by a sensor. In an exemplary embodiment, the optically recognizable film is an RE nanophosphor and other metal oxide or non-oxide complex, which blocks, absorbs, or reflects most infrared light, but transmits most other wavelengths of light.

In an exemplary embodiment, the optically recognizable ink is incorporated into a material in the form of a film, plastic, fiber, ink, concentrate, thermoplastic or thermoset matrix, thread, planchette, and/or other medium which contains in the range of about 0.001 to 40.0 wt. % of a compound derived from organic or inorganic materials. The infrared ink may be applied to a transaction card by, for example, a screen printing process or any other printing or coating means such as lithography, gravure, flexo, calendar coating, curtain coating, roller coating, and/or the like. An exemplary screen printing process utilizes a screen press equipped with drying equipment (UV curable or convection heat) and a screen with a specific mesh size of about 80 lines/cm. The optically recognizable ink is printed across any portion of the card surface of plastic using a silk screen press, as described below. The ink may be diluted to any desired amount, for example, 10-150 fold dilution.

In a preferred embodiment, the clear card stack (i.e., the subassembly layers that comprise the completed transaction card) will include (1) a single- or double-sided, vapor-deposited thin film of nanoparticles (e.g., RE metals and other metals and oxide and non-oxide metals) on a PET substrate and (2) a single- or double-pass of commercially-available NIR blocking ink modified with synthesized RE nanophosphor colloidal suspensions (e.g., Sunstone Upconverting Nanocrystals UCP 475®, Sunstone Upconverting Nanocrystals UCP 545®, Sunstone Upconverting Nanocrystals UCP 538®), silk-screened on an inner layer, polyvinyl chloride (PVC) film in the card stack. In other embodiments, one or more layers of the films and/or one or more layers of the inks of the invention may be included in the clear card stack. The invention developed is a flexible thin film optical filter that can be tuned to absorb, reflect, or transmit various wavelengths of light within the visible and infrared spectrum.

IR blocking physical vapor deposition (PVD) film comprises various ratios and combinations of RE and transition metal activators doped into the crystals for the sputtered PET thin films in order to shift the absorption/transmission up or down the electromagnetic spectrum. For some embodiments of the transparent transaction card, dopants with high absorption cross-sections in the NIR region (800-1000 nm) may be utilized. See, e.g., PCT/US11/054,593, filed Oct. 3, 2011, the disclosure of which is incorporated herein. Alternating layers of niobium pentoxide ($Nb_2O_5$), silicon dioxide ($SiO_2$), and gadolinium/yttrium/strontium oxide particles activated with either neodymium (Nd-1%), magnesium (Mg-2%), holmium (Ho-2%), erbium (Er-0.2%), and samarium (Sm-0.4%) may be sputtered onto the PET substrates. The resultant thin film yields a visibly transparent filter capable of reflecting and absorbing 70-80% of NIR light at 860 nm and 950 nm while still retaining near complete transparency in the visible regions of the electromagnetic spectrum (>98%).

Because the relative eye sensitivity of an ordinary observer for a specified level of illumination is between around 400-770 nm, infrared ink and film at over 770 nm is preferable because it is invisible to the human eye in normal white light. As such, the infrared inks and films will not substantially obscure the transparent surface of the transaction card. For example, in one embodiment, the transparent transaction card should have an optical density of <0.5 between about 450-750 nm. Additionally, the exemplary ink and film withstands card production temperatures of about 200° F. to 450° F. and includes a "light fastness period" (which is the resistance of the ink and film to fade or degrade in the presence of any light, and specifically, UV light) of about at least three years under normal credit card usage conditions. Moreover, the exemplary ink and film blocks, absorbs, or reflects the spectral output of IRED's, such as, for example, the Sankyo Seiki LED's, which is about 800-1000 nm. In one embodiment, the transparent transaction card should have an optical density of >1.3 between about 775-950 nm, and an optical density of >1.1 between about 950-1000 nm. The exemplary ink also limits the light reaching the phototransistors, so the presence of a clear card having the ink is detected in a transaction machine, such as, for example, a card grabbing-type ATM machine. Furthermore, in another embodiment, the exemplary ink and film should result in a transparent transaction card having an acceptably low color tint, e.g., a chromaticity distance of less than 0.005 from the color of a white-light source. Chromaticity is measured on the CIE chromaticity diagram. The target coordinates for the chromaticity values are centered at 0.522, 0.4169 (halogen white light source) with acceptable deviations in any direction of 0.005.

An approximate quantitative measure of the degree of coloration is the distance of a particular sample's chromaticity coordinates from the lamp source alone. For this reason, it is suitable to define the coloration specification in terms of chromaticity distance. The resulting card should have an acceptably low color tint. Targets for the overall appearance of the card may be based on the final transparency in the visible wavelengths and any apparent color or tinting of the cards was set according to specified chromaticity diagram coordinates, as discussed above.

The inks or films of the invention can be mixed with a binder to form infrared compounds for use in threads, fibers, coatings, and the like. Binders that can be incorporated in the present invention include, but are not limited to, conventional additives such as waxes, thermoplastic resins, thermoset resins, rubbers, natural resins, or synthetic resins. Non-limiting examples of such binders are, polypropylene, nylon, polyester, ethylene-vinyl acetate copolymer, polyvinyl acetate, polyethylene, chlorinated rubber, acrylic, epoxy, butadiene-nitrile, shellac, zein, cellulose, polyurethane, polyvinylbutyrate, vinyl chloride, silicone, polyvinyl alcohol, polyvinyl methyl ether, nitrocellulose, polyamide, bismaleimide, poly-imide, epoxy-polyester hybrid, and/or the like. As discussed below, films that can be used as a substrate for the PVD of the metal and non-metal ions include, but are not limited to, PET, PVC, polypropylene, polyethylene, acrylic, polycarbonate, and/or the like. As discussed below, any film can be laminated or adhered to common card articles using heat, adhesives, or a combination of both.

If the content of the optically recognizable ink and/or film is too low, adequate blocking may not be achieved and the phototransistor may not send the proper signal to the capture device, which will mean that the card will not be detected. Therefore, the infrared blocking dyes and nanoparticles in the inks and/or films are usually present in the composition at a total amount from about 1 ppm to 80.0 wt. (%), and preferably from about 0.25%-25.0% by weight. Moreover, the present invention contemplates that other materials such as, for example, UV absorbers, reflectors, antioxidants, and/or optical brighteners, may be added in order to achieve better resistance properties, aesthetics, or longevity of the materials.

Particularly, other materials may be added to allow for color shifts from one color to another color after stimulation. Commonly employed materials such as dyes, pigments, fluorescent dyes, luminous pigments, and/or the like, can be used to promote reversible color changes from one color state to another color state. Such materials can be incorporated directly with the infrared inks and films during initial processing or may be added after the infrared inks and films have been processed. The use of materials such as solvents, water, glycols, and/or the like can be added to adjust rheological properties of the material. Also, the use of surfactants, defoamers, release agents, adhesion promoters, leveling agents, and/or the like may be added to the formulations for improved processing properties. Optical brightening materials may also be added to ensure whiteness in a colorless state and to maintain a low level of contrast between many substrates where infrared inks and films are located.

In an embodiment of the present invention, an infrared ink and/or film may be printed onto one or more layers of a transaction card. The inks of the invention comprise a combination of one or more infrared dyes and other absorbers (i.e., blockers, refractors, reflectors, diffusers, etc.), and the same or different nanoparticles (e.g., RE nanophosphors). The films of the invention comprise nanoparticles, such as RE nanophosphors and other metal oxide and/or non-oxide complexes, which are preferably sputtered on a substrate (e.g., PET).

The infrared dye or absorber utilized in the inks possess high spectral coverage from 800-1000 nm, blocking at least about 97% of infrared light in that region. Exemplary infrared dyes and absorbers include, but are not limited to, pthalocyanine dyes, benz[e]indol cyanines, dibutyl amino thpenyl benzenes, hexa antimonte dyes, and the like, available commercially from HW Sands, Adams Gate Company, Epolin, Avecia. The dyes can be found commercially under the following commercial names MSA4800®, MSB4833®, and MSD3600® from HW Sands, EPOLIGHT 4148® from Epolin, Inc., and IR Dye 5630® from Adam Gates Company. One of skill in the art would recognize that any infrared dye or absorber having infrared absorption peaks from 800-1000 nm may be utilized to provide a broad range of infrared absorption in the invention. Preferably, one or more infrared dyes and/or absorbers having infrared absorption peaks at 850 nm and 1000 nm are utilized. A combination of two or more dyes and absorbers are preferably used. Moreover, the dyes and other absorbers (nanoparticles) of the present invention may be present in an amount between about 0.0001 wt. % and about 20 wt. %, either alone or in combination, depending on the desired transparency and chromaticity in the visible region.

The infrared inks further comprise nanoparticles (e.g., RE nanophosphors and other metal nanoparticles). The RE activated crystal absorbers that may be used in the ink include, but are not limited to, $LaF_3$, $CeF_3$, $NdF_3$, $PmF_3$, $SmF_3$, $GdF_3$, $YbF_3$ $LuF_3$, $NaGdF_3$, $Gd_2OS_2$, $CeO$, $GdOCl$, $Y_2O_3$, $Y_2O_2S$:Sm, $Y_2O_2S$:Yb, $YVO_4$, $Y,Gd_2$:$O_3$:Mg, $Y_2O_3$:Nd,Ho, $Sr_2S$:Sm,Er, $Gd_2O_3$:Yb, and $NaYF_4$:NdTm. PCT/US11/054,593, filed Oct. 3, 2011, the disclosure of which is incorporated herein, discloses preferable RE nanophosphors that may be used in inks of the invention. PCT/US11/054,593 also discloses methods for making the preferable RE nanophosphors. The RE nanophosphors disclosed in PCT/US11/054,593 have high degrees of tunability over various parameters, such as optical signatures (absorption/emission), morphology, and size. Preferable RE nanophosphors include, but are not limited to, a plurality of monodisperse particles having: a single pure crystalline phase of a rare earth-containing lattice, a uniform three-dimensional size, and a uniform polyhedral morphology. Various compositions of RE nanophosphors and other metal composite crystal absorbers may be utilized in the present invention to enhance the optical density in the NIR regions from 775-1000 nm. The RE nanophosphors of the invention provide for broad absorption in the NIR (see FIG. 1).

Table 1 describes exemplary nanoparticles (e.g., RE nanophosphors and other metal nanoparticles (e.g., MgO, CuO)) and their chemical compositions. Besides enhancing the optical density in the NIR regions from 775-1000 nm, the crystal absorbers may also be incorporated as a forensic tag, for example, for identification of manufactured materials to ensure authenticity of the product as well as overall quality and function (see, e.g., Table 1). When the crystal absorbers are excited under UV light, a unique spectral peak arising at 1.5 microns can be observed utilizing NIR spectroscopy. The RE nanophosphors may be present in the inks in an amount between about 0.01 wt. % and about 5 wt. %, and may be used either alone or in combination. Depending on the type of tinting needed, various levels of transparency and chromaticity may be obtained by adjusting the types and/or amounts of the components in the ink composition.

TABLE 1

Rare Earth/Other Metal crystals Combined in various ratios for enhancement of NIR Blocking Inks

| Std Name | Formula | Avg. Size | Function |
|---|---|---|---|
| Strontium Titanate | $SrTiO_3$ | 200 nm | NIR Blocker |
| Lithium Niobate | $LiNbO_3$ | 200 nm | NIR Blocker |
| Yttrium, Gadolinium Magnesium Oxide | $Y, Gd_2$:$O_3$:Mg | 100 nm | NIR Blocker |
| Magnesium Oxide | MgO | 150 nm | NIR Blocker |
| Yttrium Oxide | $Y_2O_3$:Nd, Ho | 200 nm | NIR Blocker |
| Strontium Sulfide | $Sr_2S$:Sm, Er | 200 nm | Forensic |
| Gadolinium Oxide | $Gd_2O_3$:Yb | 200 nm | Forensic |
| Sodium Yttrium Fluoride | $NaYF_4$:NdTm | 250 nm | NIR Blocker |

In another embodiment of the present invention, in addition to or alternatively to the infrared ink, discussed above, an optically recognizable film may be printed onto one or more layers of a transaction card. The optically recognizable film comprises infrared blocking ingredients, including nanoparticles, such as the same or different RE nanophosphors, discussed above for the ink composition, and other metal oxide and/or non-oxide complexes (e.g., vanadates, fluorides, chlorides, garnets, etc.), which are preferably sputtered on a substrate (e.g., PET). Exemplary films that can be used as a substrate for the PVD of the metal and non-metal ions include, but are not limited to, PET, PVC, polypropylene, polyethylene, acrylic, polycarbonate, and/or the like.

Figure 2:
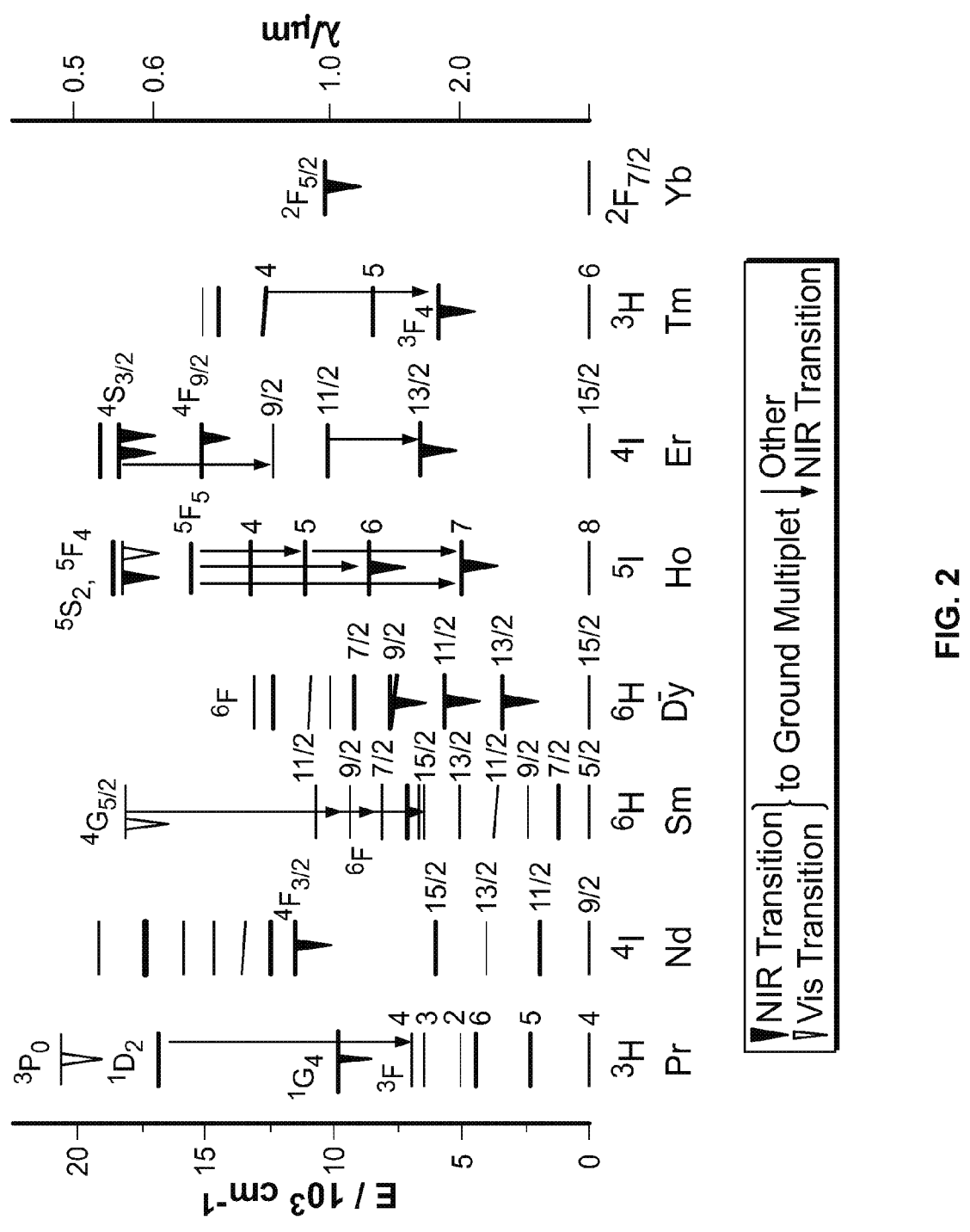

The films of the invention comprise RE-activated crystal absorbers, including, for example, the same nanoparticles and RE nanophosphors described above for the ink composition (see, e.g., PCT/US11/054,593). The RE nanophosphors and other metal nanoparticles may be present in the films in an amount between about 0.01 wt. % and about 5 wt. %, and may be used either alone or in combination. FIG. 2 provides exemplary RE dopants and their NIR transitions that may be utilized to achieve the NIR absorption and/or reflective properties of the sputtered PVD films of the invention. There may be a difference of surface modification in order to suspend the nanoparticles in the ink versus using them for the vapor deposition.

The films of the invention also comprise other metal oxide and non-oxide complexes. The metal oxide and non-oxide complexes include, but are not limited to, silicon dioxide, strontium titanate, yttrium oxide, magnesium oxide, copper oxide, gadolinium oxide, lithium niobate, sodium yttrium fluoride, neodymium oxide, ytterbium oxide, vanadates, fluorides, chlorides, and garnets. See, e.g., PCT/US11/054,593.

In an embodiment of the invention, a multilayer sputtering technique utilizing nanoparticles (e.g., RE nanophosphors) and other metal oxide and non-oxide complexes on flexible substrates (e.g., PET, PVC) may be utilized. The number of layers in the coating may range from a single thin film layer for simple antireflection or barrier coatings to multilayer stacks of thin films having numerous coatings for applications such as the blocking of infrared and transmission of visible light. As with substrate materials, the coating materials and the physical and optical thicknesses are selected to attain the desired optical properties, although the chemical and physical properties of the thin films may be a concern. Composition and microstructure-dependent properties such as mechanical stress, moisture content, crystallization, and surface morphology of the thin films may affect the reliability and performance of the material. For example, crystallization can cause stress-induced cracking and rough morphology resulting in optical scattering and loss of mechanical and optical integrity of the coatings. Preferably, a thin film optical coating capable of blocking infrared while still limiting the visible light scatter occurs during the initial synthesis of the RE and other metal oxide and non-oxide complexes. Preferably, nanoparticles of high uniformity and monodispersity with narrow size distributions may be used. To this effect, nanoparticle synthesis procedures capable of producing highly uniform optically active metal oxides and halides for incorporating into PVD Sputtering of thin films may be used.

Sputtering produces very high quality coatings, and can be done over very large areas (e.g., targets can be 6-10 feet long). It is used for architectural glass, electronics, and, more recently, tools and decorative finishes (watchstraps, bezels, automotive lights, pens, etc.). Sputtered coatings are generally high quality (although they may contain trapped particles similar to macroparticles). Sputtering can be done at low temperatures (although close process control and good cleaning may be required), and almost any material can be sputtered, including complex materials (such as hydroxyapatite—bone) that can be RF (radio frequency) sputtered. Traditionally, sputtering has always been the slowest deposition method, but High Rate Reactive Sputtering (HRRS) has improved deposition rates (although not to the speed of evaporation). In order to sputter coatings reactively at high rates, good control of the partial pressure of the active gas to prevent its poisoning the cathode, which reduces the deposition rate by an order of magnitude, should be kept. (Oxide coatings may be especially difficult in this respect.) The process may be controlled by partial pressure monitoring with closed loop feedback control, which may be an additional complication. For high volume production, the cost of sputter targets is the primary cost factor in the process, and difficulties in obtaining sufficiently strong targets of brittle materials such as chrome may be encountered.

Other methods known to those of skill in the art may be used to sputter the nanoparticles (e.g., RE nanophosphors) and other metal oxide and non-oxide complexes on flexible substrates, including, for example, evaporation (e.g., ion plating, e-beam PVD, hollow cathode), other sputtering methods (e.g., balanced magnetron, unbalanced magnetron (UBM), DC, RF), arc (e.g., cathodic, anodic, random, steered, confined, ducted), and ion-assisted (e.g., sputtering evaporation, ion sputtering, metamode).

Sputtering of RE and Metal Thin Films on PET

The three major commercial hard coating technologies all draw their ions from a plasma formed in the gas in the chamber (which is usually at a pressure of a few millitorr). Most hard coatings are compounds that are deposited reactively, by combining the metal with active gas (N or C) at the surface of the growing coating.

Evaporation PVD (Ion Plating)

This technique has proven to yield the greatest success and best functioning IR blocking films. The highest quality coatings are produced by the electron beam evaporation methods. The major advantages of this method are its high quality and the low cost of evaporation materials.

The inks and films described above may be combined together with binders, resins, catalysts, and other compounds useful for creating an ink from the materials. Preferably, solvent may be utilized, including preferably, 2-ethoxy-ethyl propionate, ethyl acetate, n-propyl acetate, ethyl alcohol, n-propanol, and methyl ethyl ketone. The solvent may be present in an amount between about 5 wt. % and about 60 wt. %. Moreover, the infrared dyes and/or absorbers may be loaded in a liquid vehicle, at approximately 1% loading. An exemplary water-based liquid vehicle used is Sericol® Mixing Clear. Other solvent based liquid vehicles can be obtained commercially from Sericol as well as Apollo Colour and HW Sands. Resins useful for the present invention include VMCH, VMCA, polyamide, polyester, linseed alkyl resins and acrylic, and may be present in an amount between about 8 wt. % and about 35 wt. %. A silane-type catalyst may be used to help bond the infrared dye and/or absorber to the resin. Specifically, the silane-type catalyst may be used to ring-open the infrared dye and/or absorber molecule and help the molecule bind to the resin, such as, for example, acrylic. A preferable silane-type catalyst includes 3-amino-propyl triethoxy silane, although the present invention should not be limited, as stated herein. The silane-type catalyst may be present in an amount between about 0.005 wt. % and about 2.00 wt. %. Most preferably, the silane-type catalyst is present at about 500 ppm.

The infrared inks and films of the invention may be printed on one or more layers of a transaction card by methods known to those of skill in the art. The printing method is typically chosen based on the composition of the various formulations outlined above. Various printing methods may preferably include gravure, silkscreen, and lithographic processes, although ink-jet, roll-coating, and flexographic methods may be utilized as well. The infrared inks, infrared films, and/or substrates of the exemplary embodiments and their placement and thickness can vary to accommodate different types of core substrates and thicknesses thereof. In addition, PVC is preferably utilized as a printable substrate. However, other substrates such as PETG, polycarbonate, and PET may be utilized provided there are at least slight differences in refractive index between the infrared ink, infrared film, and the substrate.

The present invention allows for the easy production of IR-blocking and/or absorbing transaction cards without adhesives and/or subassemblies. For example, FIGS. 3 and 4 below illustrate preferred cross-sections of transaction cards according to the invention. The transaction cards shown in FIGS. 3 and 4 include infrared inks and/or films, described above, for allowing the transparent or translucent transaction card to be recognized by card reading devices, such as ATMs, and/or for allowing the transparent transaction card to be recognized and counted during card fabrication. The transaction cards shown in FIGS. 3 and 4 can be used for credit, charge, debit, access, identification, information storage, electronic commerce, and/or other functions. The thickness (mil) of each layer is shown on the left-hand side of each figure.

The transaction card shown in FIG. 3 comprises a front and back surface of clear PVC over laminate. One skilled in the art will appreciate that the front and back surface may be any suitable transparent, translucent, and/or opaque material such as, for example, plastic, glass, acrylic, and/or any combination thereof. Each sheet is substantially identical and is preferably about 1.8 mil thick. The fabrication of the individual card sheets includes either direct layout (11 layers) of film or the use of a sub-assembly (9 layers). An exemplary sub-assembly shown in FIG. 3 consists of 9 layers of film with room temperature tack adhesive applied over thermoset and thermoplastic adhesives. The resulting cards comprise (from the card front towards the card back) 1.8 mil outer laminate (clear PVC over laminate) having the holographic foil, embossed surface, and other indicia on its surface (all of which are not shown), 9.0 mil clear front PVC core with print side out (card front), 0.25 mil infrared ink: A, 0.75 mil printed adhesive: A, 1.5 mil inlay, 0.75 mil printed adhesive: A, 0.25 mil infrared ink: B having an IC chip, 9.0 mil PVC, 0.25 mil infrared ink: C, 5.0 mil clear back PVC, and 1.8 mil outer back (clear PVC over laminate), with a signature panel, applied magnetic stripe, and other indicia (all of which are not shown). Infrared inks A, B, and C in the transaction card shown in FIG. 3 utilized combinations of commercially available silkscreen inks and dyes modified with RE crystals and were printed as multiple, separate layers on PVC films for a total of three NIR blocking barriers. Two of the ink barriers (labeled B and C in FIG. 3) utilize a combination of NIR blockers sold by Adam Gates Company, Hillsborough, N.J. and H.W. Sands, Jupiter, Fla. under the nomenclature IR Dye 5630® and MSA4800®, respectively, and are further modified with RE activated crystal absorbers at 1% listed in Table 1 above. Both inks are combined in a 2:1 ratio and diluted to a final concentration of 1% in Sericol Mixing Clear Silkscreen Binder (TM-MX) and printed double-pass on both sides of the internal PVC film. The third barrier layer (labeled A in FIG. 3) consists of specific ratios of three commercial inks: MSB4833® and MSD3600® from HW Sands, and 4148® from Epolin, Newark, N.J. (2:1:1) at a total concentration of 1.5% with the adhesive detailed above. The ink mixture is again modified with the same RE crystals as in barriers B and C at 1%.

As discussed above, various compositions of RE and other metal composite crystal may be utilized to enhance the optical density in the NIR regions from 775-1000 nm. Table 1 above describes the various crystal and their chemical compositions. Additionally, one crystal composition is incorporated as a forensic tag for identification of our manufactured materials to ensure authenticity of the product as well as overall quality and function. When the material is excited under UV light a unique spectral peak arising at 1.5 microns can be observed utilizing NIR spectroscopy.

The printed adhesive layers A preferably comprise polyester-based adhesive. Specifically, a preferable material that may be used as the polyester-based adhesive is Bemis Associates Inc. 5250® Adhesive Film. Alternatively, another preferably material that may be used as the polyester-based adhesive is Transilwrap Company, Inc. Trans-Kote® Core Stock KRTY.

After placing the layers of the transaction card shown in FIG. 3 together in registration (or some variation thereof that is apparent to one having ordinary skill in the art), the layers are laminated in a stack lamination unit for approximately 11 minutes at about 300° F. to about 310° F. under pressure and then cooled for an additional 15 minutes at about 50° F. to about 60° F. The resulting transparent card is approximately 30.35 mils and possesses good durability and sufficiently blocks infrared light from between about 800-1200 nm with an optical density of greater than 1.3.

Figure 4:
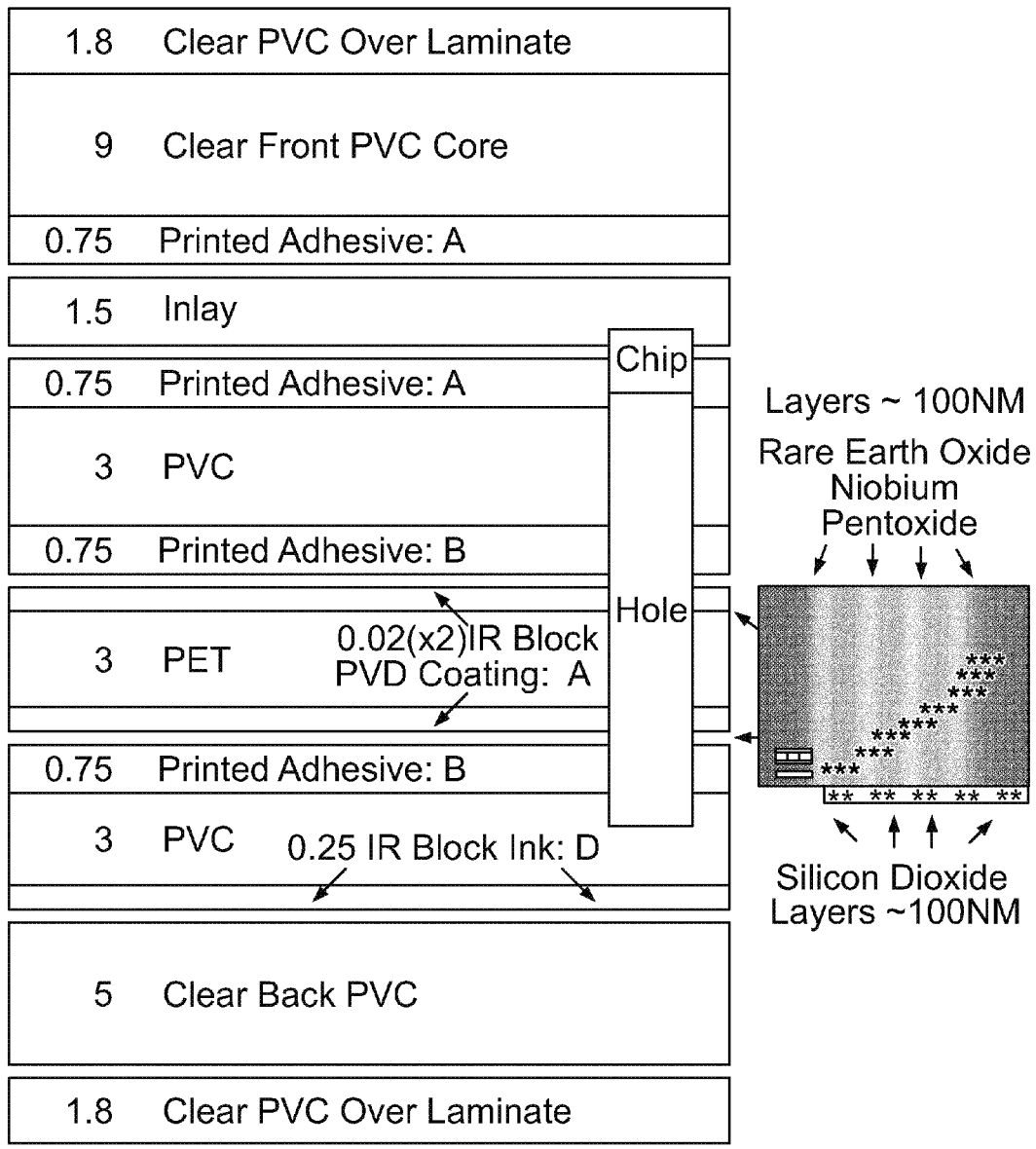
FIG. 4 illustrates a cross-section of a transaction card of the invention.

FIG. 4 illustrates an alternative preferred embodiment of the transaction cards of the invention. FIG. 4 comprises a front and back surface of clear PVC over laminate. Like the transaction card in FIG. 3, one skilled in the art will appreciate that the front and back surface may be any suitable transparent, translucent, and/or opaque material such as, for example, plastic, glass, acrylic, and/or any combination thereof. Each sheet is substantially identical and is preferably about 1.8 mil thick. The fabrication of the individual card sheets includes either direct layout (13 layers) of film or the use of a sub-assembly (11 layers). An exemplary sub-assembly shown in FIG. 4 consists of 11 layers of film with room temperature tack adhesive applied over thermoset and thermoplastic adhesives. The resulting cards comprise (from the card front towards the card back) 1.8 mil outer laminate (clear PVC over laminate) having the holographic foil, embossed surface, and other indicia on its surface (all of which are not shown), 9.0 mil clear front PVC core with print side out (card front), 0.75 mil printed adhesive: A, 1.5 mil inlay, 0.75 mil printed adhesive: A, 3.0 mil PVC, 0.75 mil printed adhesive: B, having an IC chip, 0.02 infrared blocking PVD film coating: A, 3.0 PET, 0.02 infrared blocking PVD film coating: A, 0.75 mil printed adhesive: B, 3.0 PVC, 0.25 mil infrared ink: D, 5.0 mil clear back PVC, and 1.8 mil outer back (clear PVC over laminate), with a signature panel, applied magnetic stripe, and other indicia (all of which are not shown). Infrared blocking PVD film coatings: A in the transaction card shown in FIG. 4 have the following composition: niobium pentoxide, ytterbium oxide, and silicon dioxide. Infrared ink D in the transaction card shown in FIG. 4 is identical in composition to the NIR barrier A used in the transaction card shown in FIG. 3 above, but the ratios of the three commercial dyes and the doping concentration of the RE crystals were adjusted. The three commercial inks: MSB4833® and MSD3600® from HW Sands, 4148® from Epolin, Newark, N.J. were mixed in a 1:2:1 ratio and were diluted to a final concentration of 0.5% in Sericol Mixing Clear Silkscreen Binder (TM-MX). The ink mixture is again further modified with RE activated crystal absorbers listed in Table 1 above, but at 2%. The printed adhesive layers A and B preferably comprise polyester-based adhesive. Specifically, a preferable material that may be used as the polyester adhesive is Bemis Associates Inc. 5250® Adhesive Film. Alternatively, another preferably material that may be used as the polyester-based adhesive is Transilwrap Company, Inc. Trans-Kote® Core Stock KRTY.

After placing the layers of the transaction card shown in FIG. 4 together in registration (or some variation thereof that is apparent to one having ordinary skill in the art), the layers are laminated in a stack lamination unit for approximately 11 minutes at about 300° F. to about 310° F. under pressure and then cooled for an additional 15 minutes at about 50° F. to about 60° F. The resulting transparent card is approximately 31.39 mils and possesses good durability and sufficiently blocks infrared light from between about 800-1200 nm with an optical density of greater than 1.3.

After the card sheets in FIGS. 3 and 4 are laminated, according to the method described above or via any other method, the sheets are cut into individual cards by a known stamping process, including any necessary curing, burrowing, heating, cleaning, and/or sealing of the edges. Each individual transaction card is about 2.5"×3.0", and, therefore, conform to ISO standards for transaction card shape and size.

In a further embodiment of the present invention, fibers of various materials are used either in a continuous manner or single fibers can be incorporated into a wide variety of materials. The present invention contemplates, for example, natural fibers, synthetic fibers, copolymer fibers, chemical fibers, metal fibers, and/or the like. Examples of these fibers may be nylon, polyester, cotton, wool, silk, casein fiber, protein fiber, acetalyated staple, ethyl cellulose, polyvinylidene chloride, polyurethane, acetate, polyvinyl alcohol, triacetate, glass, wood, rock wool, carbon, inorganic fibers, and/or the like. Such fibers can be incorporated or mixed into other types of materials such as paper pulp, plastic label stock, plastic materials, and the like. Such materials can be used alone in a continuous manner or can be used as mono- or di-filaments in other materials.

Moreover, the infrared inks and films that are incorporated into plastics can be used with a wide variety of materials, such as, for example, nylon, acrylic, epoxy, polyester, bismaleimide, polyamide, polyimide, styrene, silicone, vinyl, ABS, polycarbonate, nitrile, and/or the like. As such, the compounds that are incorporated into fibers, plastics, film and/or the like, may be processed directly to a suitable form in a single- or multi-process application. Such infrared inks and films can be added into a formulation in the form of a single ingredient or in the form of a master-batch that is then processed in a similar manner to normal processing operations of compounds. Processing of such compounds includes the use of continuous mixers, two- or three-roll mills, extrusion, and/or other melt-compounding methods of dispersion. While in an exemplary embodiment, the thread can be woven or non-woven, the infrared materials may be extruded directly into a thermoplastic matrix and drawn directly into the form of a thread that can be used in a continuous manner or sectioned in the form of a fiber or plastic film.

The exemplary infrared inks and films are deposited onto films of various compositions and can be used in most card applications. Moreover, the infrared inks and films in accordance with the present invention can be used alone or blended with other materials at ranges from 0.001 to 50.0 parts by weight, but most preferable from 1.0 to 15.0 parts by weight.

In a further exemplary embodiment, the optically recognizable inks and films block light which is detectable by machines. More particularly, the machines suitably detect the presence of a card via infrared interference at one or several wavelengths. In an exemplary embodiment, detection of materials may include the production of a visual effect when the materials are interrogated with invisible infrared radiation from the proper instrument, and when such radiation contacts the infrared material, a visual effect, such as a colored light, can be seen. Alternatively, the materials may be detected by a remote detector that will indicate the presence of the materials. Detection or authentication of the materials occurs above and below the stimulation wavelength of the reading device. As such, once the optically recognizable ink or film has been detected, the detection device may then provide the user with a positive identification signal, which is preferably located on or near the detection device.

In an exemplary embodiment, the detection of infrared materials triggers the sensors in ATM machines. In particular, the present invention allows for the passage of a greater percentage of visible light (from about 400-700 nm), which allows the card to appear transparent or translucent in nature, while allowing for the blockage of certain light (from about 700 nm and above) to allow the phototransistors in ATM's to detect that a card has been inserted into the carriage mechanism. As discussed above, an exemplary ATM sensing device includes an IRED, a filter, and a phototransmitter.

In addition to triggering the sensors in ATM machines, translucent or transparent transaction cards of the invention can be used with any magnetic stripe or smart card reader. The reader system can include a card reader/writer, a point-of-sale terminal, ATM, or any other acceptance device. In an exemplary embodiment, a transaction card of the invention is used in conjunction with a reader which, not only detects the existence of the card, but also illuminates the transparent portion of the transaction card when the card is inserted into the reader. The illumination source can be either an incandescent or solid state source (infrared emitting diode or laser). In operation, when the card is inserted into the acceptance device, the edge of the card presses against the illumination assembly (or activates a switch, interrupts a beam, etc.). Depending upon the application of the card, the illumination source can be under the control of the acceptance device or external software. Thus, the illumination source can flash or display a particular color if directed by the external software program. Additionally, depending on the structure of the card, the illumination source could be used to excite an embedded design useful for security or product enhancement.

The present invention will now be illustrated in greater detail with reference to the following examples, comparative examples, test examples, and use examples. As disclosed in the examples, tests and graphs herein, the resulting inks sufficiently block IR radiation from phototransistor detection. It is understood that the present invention is not limited thereto. For example, one skilled in the art will appreciate that, in any of the examples, the ink may contain other materials for different optical effects or authentication purposes.

EXAMPLES

Ink Formulation Preparation

For the examples described herein, specially designed ratios of IR absorbing inks and RE nanophosphors were evaluated for effectiveness and overall aesthetic appeal. The RE nanophosphors were synthesized via thermal decomposition in a high temperature salt bath. The RE nanophosphors were prepared using the methods disclosed in PCT/US11/054,593. 2.6 mmol of niobium acetate was weighed and dissolved in a 1:1 ratio of 1-octadecene (ODE) and oleic acid (OA) in a 100 ml, 3-neck flask. The mixture was heated at 110° C. under vacuum for 45-60 min until a clear solution was obtained. The solution was then transferred to a molten salt bath, maintained at a steady temperature of 341-343° C. for the entirety of the reaction, while purging with $N_2$ gas. The solution reacted for 45 min while stirred. Upon completion of the 45 min reaction, the flask was removed from the salt bath and the solution was quenched with room temperature ODE.

The particles were precipitated with a hexane/acetone solution (1:1) and centrifuged at 8300 rpm for 3 min. The collected particles were washed once more with hexane/acetone and re-suspended in water.

The examples sought to identify preferable compositions giving sufficient blocking in the infrared regions while still maintaining an overall transparent appearance with a slight hue within the acceptable aesthetic limits of visible transparency and chromaticity. The required specifications are described below:

Specifications:

The optical properties of the solution meet the ISO specifications only for wavelengths from 775-1000 nm.

Visible Transparency: The resulting card has an optical density of <0.5 in the wavelength range from 450-750 nm.

Color Tint: The resulting card has a low color tint, which can be further optimized to reduce the tinting or adjust the hue.

NIR Opacity: The resulting card possesses optical density of >1.3 in the wavelength range from 775-950 nm, and an optical density of >1.1 in the wavelength grange from 950-1000 nm.

*all commercial IR absorber ink ratios used are listed as follows: H.W. Sands: Amer. Dye: Adam's Gate Film Preparation—Synthesis of Thin Film PVD of Oxide Precursors Conventional PVD and Direct Current (DC) sputtering was used for depositing SiO and other conductive layers, while pulse-modulated DC technique was used for depositing $Nb_2O_5$, $RE_2O_3$, and other insulating layers. PET films (9-mil in thickness) were purchased pre-coated with acrylic anti-abrasion layer and used as substrates. The PET film substrate was placed on a glass plate and adhered to the plate using polyimide tape. An RF electrode was located in the back side of the glass plate. Before the sputter deposition, RF plasma treatment was carried out in different gas atmospheres. Argon and nitrogen as well as oxygen gas were introduced into the chamber through mass flow controllers. The gas composition and treatment time were varied and the effects on the adhesion strength were monitored.

The underlying layer was deposited on the plasma-treated film substrate in order to improve the adhesion of the inorganic layer (SiO) on the organic substrate. After these pre-treatments, the metal oxide layers were sputter deposited on the PET substrate.

Optical properties of the samples were measured by an Ocean Optics spectrophotometer (USB6000). Additional layers of the IR reflection coating were sputtered and re-read on the spectrophotometer until the infrared blocking reached 90%.

RE oxides and Niobium and Silicon oxides were prepared via thermal decomposition route (see, e.g., PCT/US11/054, 593). Alternating layers of niobium pentoxide ($Nb_2O_5$) and various RE oxides ($RE_2O_3$) are applied using the Ulvac ULDis Meta Mode 3000. The combination of the electron Hall current confinement and the central ion flow creates a dense plasma with charged particle densities approaching $10^{12}$ charged particles per $cm^3$. Each layer was determined to be approximately 50-100 nm thick, measured using UV-Vis spectroscopy. A sputtering temperature of 90° C. was maintained throughout the entire coating process for each layer. The flow rate of the metal oxide IR blockers was set at ~50-sccm (Std. Cubic Centimeters/Min). A base layer of Silicon oxide is sputtered onto the PET surface to achieve optimum adhesion of the metal ions. The final, multilayer thin film coating was sputtered on 5-mil PET substrate using the Ulvac ULDis Meta Mode yielding a total thickness of 9-mil. Additionally, a separate layer of binding adhesive was screen printed on the opposite surface of the optical barrier coating for future incorporation into the pre-designed card stack and lamination.

TABLE 2

| Example | Solution (Ink/Film) | IR Blocking (Oberthur*) | Visible Tint |
|---|---|---|---|
| 1 | Ink | 6.8 | yellow/grey (faint) |
| 2 | Ink | 5.8 | yellow/grey (dark) |
| 3 | Ink | 6.0 | grey (faint) |
| 4 | Ink | 6.8 | blue/grey (faint) |
| 5 | Ink | 6.3 | grey |
| 6 | Ink | 6.4 | yellow/grey |
| 7 | Ink | 5.4 | grey |
| 8 | Ink | 4.6 | blue(dark) |
| 9 | Ink | 4.6 | blue |
| 10 | Ink | 2.7 | blue (faint) |
| 11 | Ink | 4.5 | clear/grey |
| 12 | Film | 6.2 | clear |
| 13 | Film | 6.0 | clear |
| 14 | Film | 5.9 | clear |
| 15 | Film | 6.0 | clear |
| 16 | Film | 5.4 | clear/grey |
| 17 | Film | 8.0 | clear |
| 18 | Film | 6.0 | clear |

*IR ISO specifications met if Oberthur reading <6.2

Figure 5:
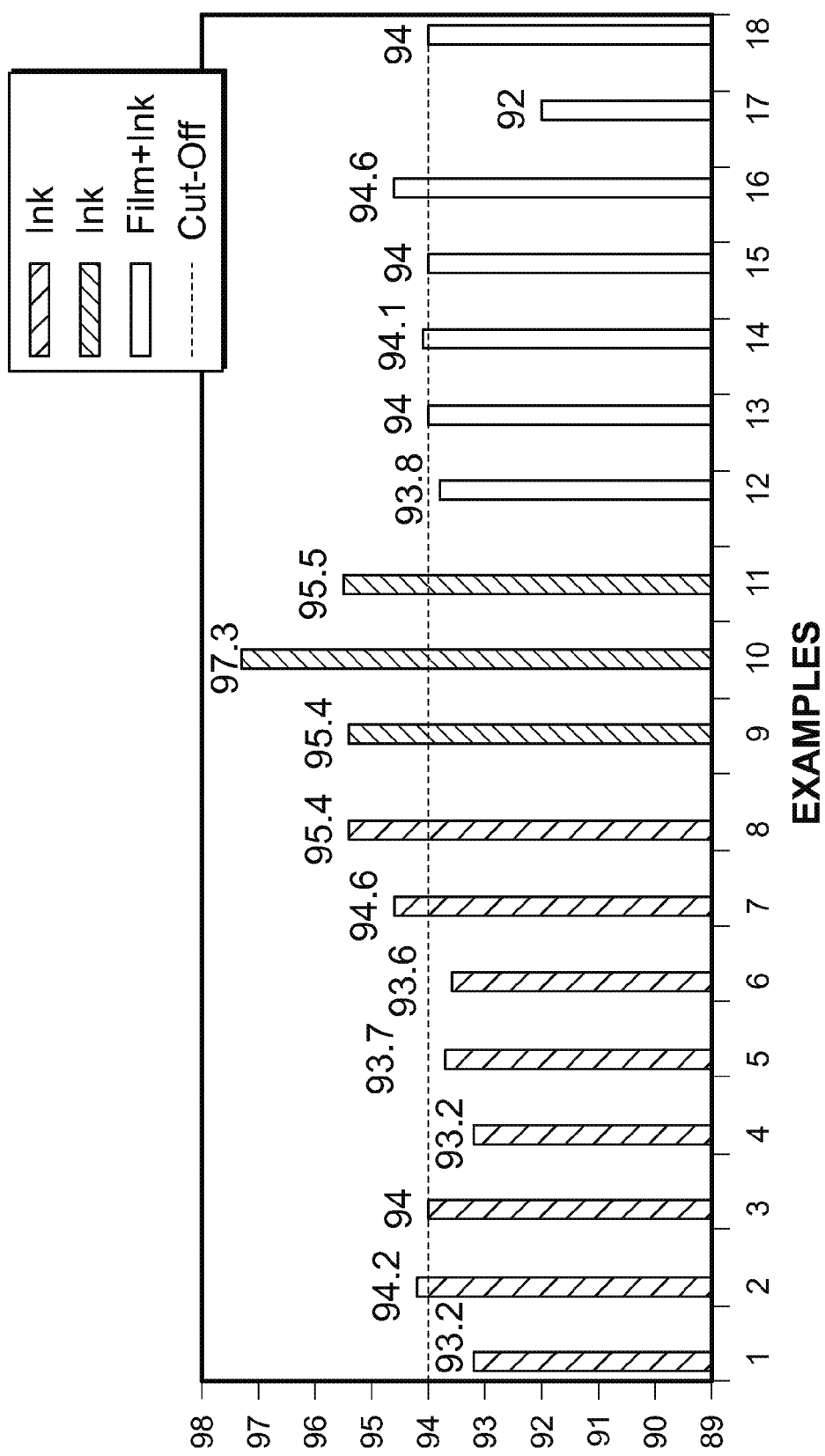
FIG. 5 shows a histogram depicting the acceptable ISO defined cut-off limits for IR transmissivity of various ink/film compositions.

FIG. 5 provides a histogram depicting the acceptable ISO defined cut-off limits for IR transmissivity of various ink/film compositions, both individually and in combination. Card meeting or exceeding the ISO specifications exhibit a minimum of about 94% IR blocking ability and about 6% IR transmission (y-axis).

Example 1

Silk Screen Ink (65% Nanophosphor Loading/Ink Absorber Ratio 5:1:1)

Figure 6:
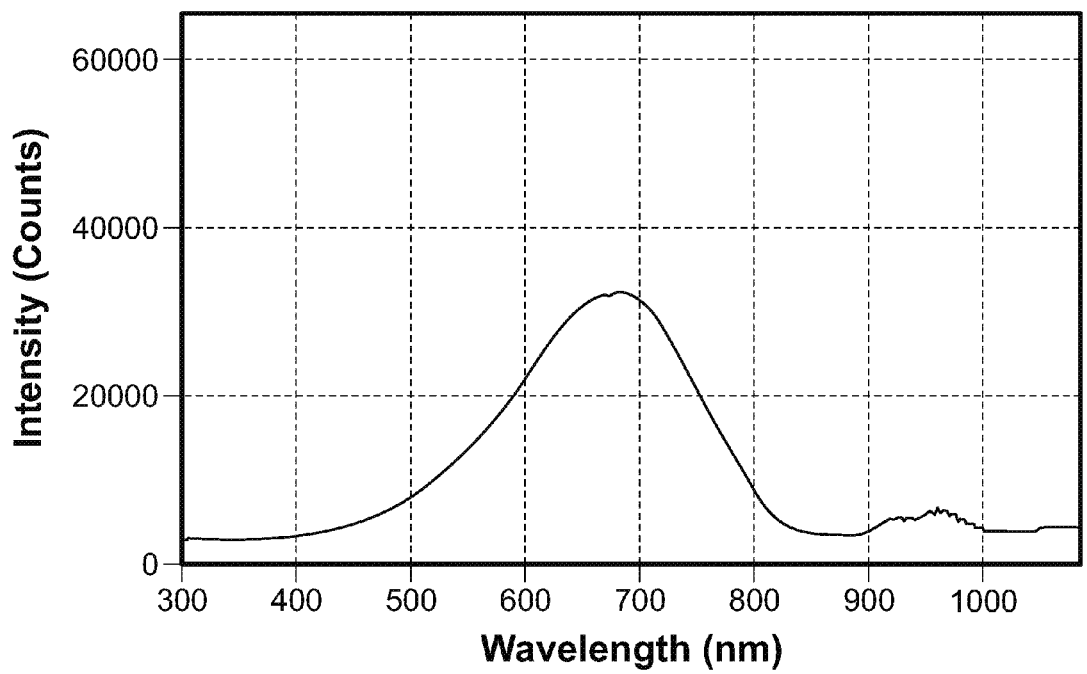
FIG. 6 shows the visible and IR transmission spectra for Example 1.

A single pass coating of IR absorber ink was applied to the PVC inner layer. The sample was near infrared absorption/blocking specification; however, there was a significant yellow tint to the card. See FIG. 6.
Oberthur IR Spectrometer Readout of Example 1 (Pass—6.0, 94% Blocking in the IR)—6.8

Example 2

Silk Screen Ink (65% Nanophosphor Loading/Ink Absorber Ratio 6:2:1)

Figure 7:
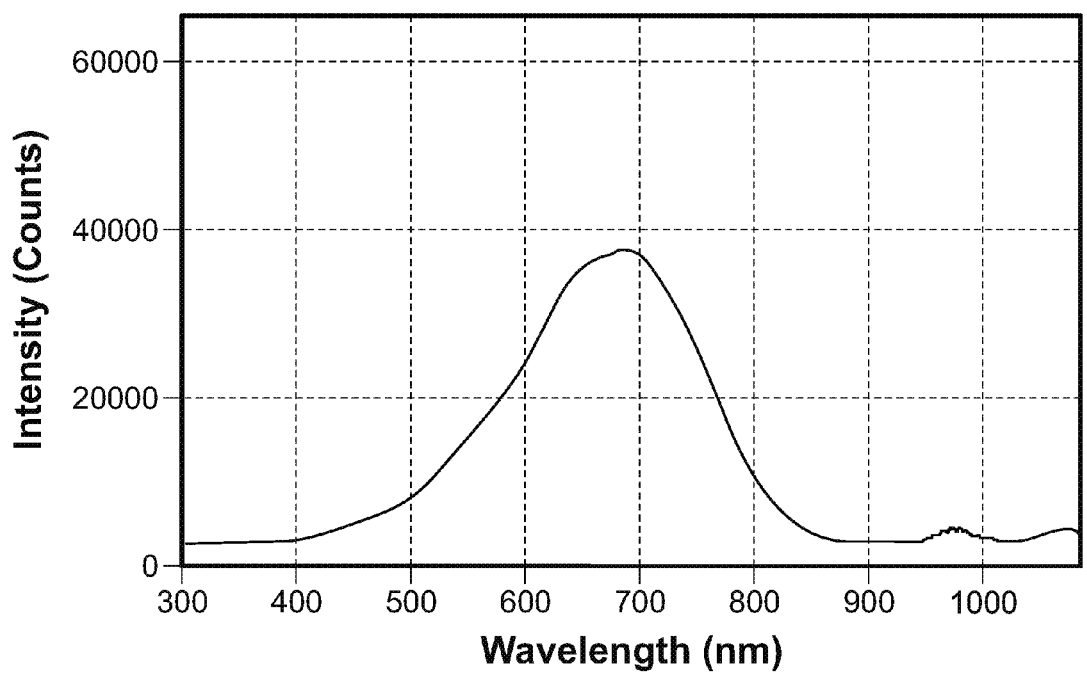
FIG. 7 shows the visible and IR transmission spectra for Example 2.

A single pass coating of infrared absorber ink was applied to the PVC inner layer. The sample was at infrared absorption/blocking specification; however, there was a significant tint to the card not meeting ISO specifications. See FIG. 7.
Oberthur IR Spectrometer Readout—5.8

Example 3

Silk Screen Ink (65% Nanophosphor Loading/Ink Absorber Ratio 5:2:1)

Figure 8:
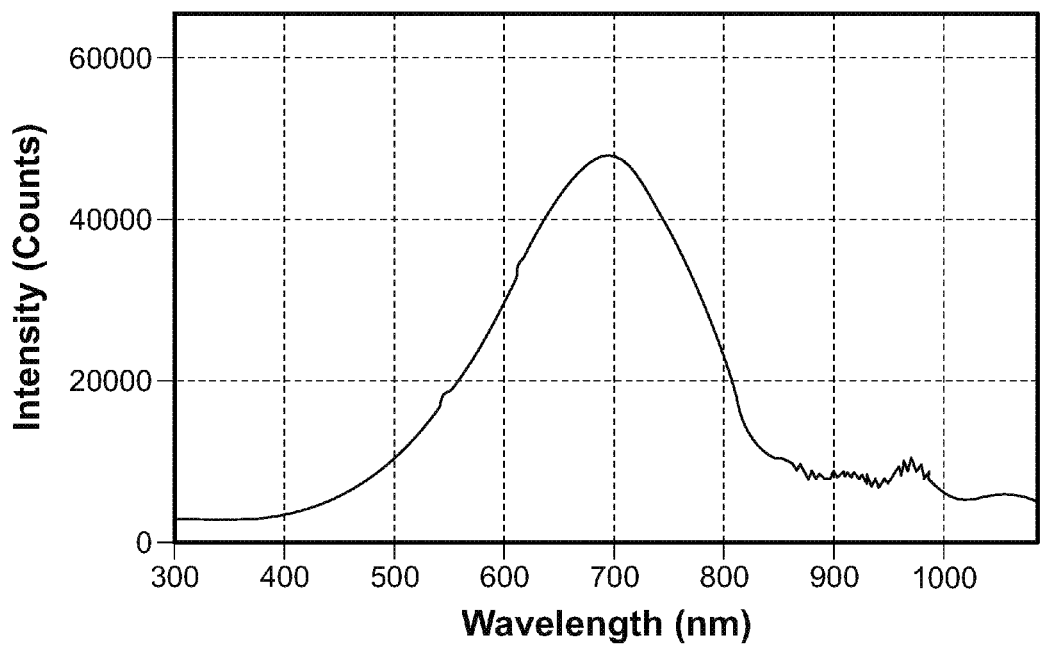
FIG. 8 shows the visible and IR transmission spectra for Example 3.

A single pass coating of infrared absorber ink was applied to the PVC inner layer. The coating met the infrared absorption/blocking specification, but there was a slight grey tint to the card. See FIG. 8.
Oberthur IR Spectrometer Readout—6.0

Example 4

Silk Screen Ink (65% Phosphor Loading/Absorber Ratio 4.0:1:1)

Figure 9:
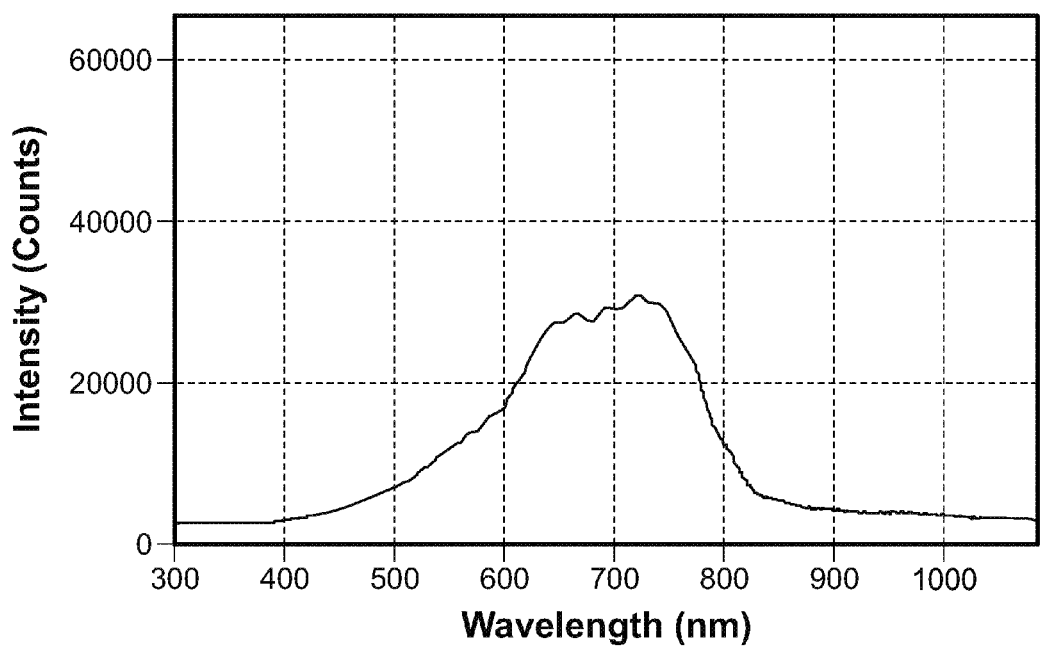
FIG. 9 shows the visible and IR transmission spectra for Example 4.

A double pass coating of infrared absorber ink was applied to both sides of the PVC inner layer. The visible tint to the card was decreased, but the infrared blocking was also decreased. See FIG. 9.
Oberthur IR Spectrometer Readout—6.8

Example 5

Silk Screen Ink (65% Phosphor Loading/Absorber Ratio 4.0:1:1)

Figure 10:
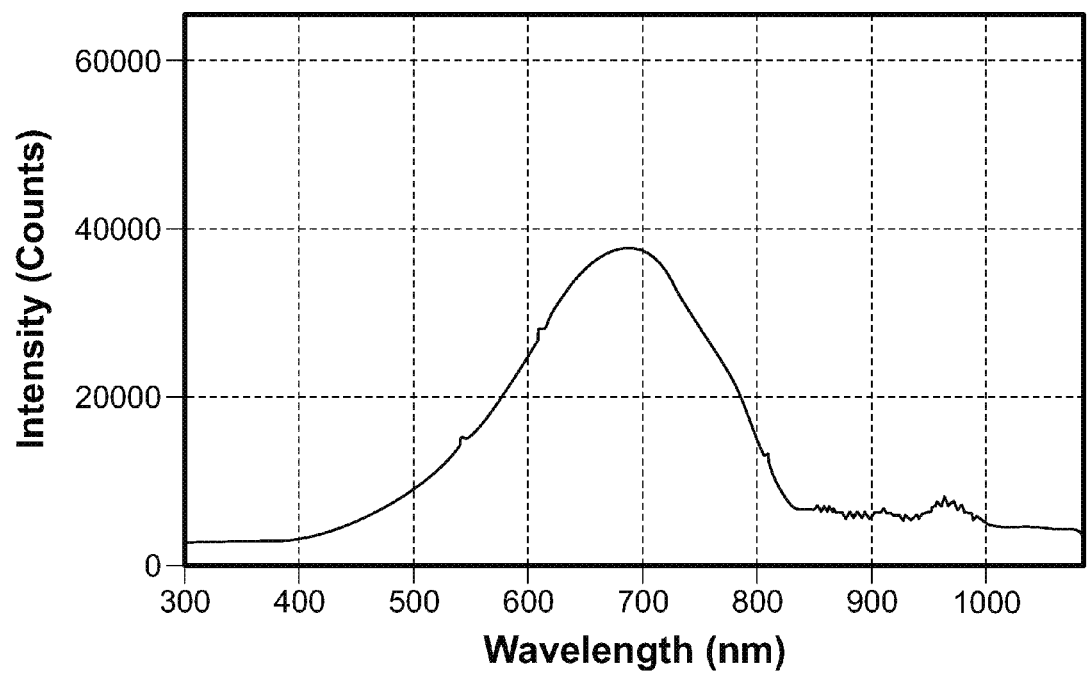
FIG. 10 shows the visible and IR transmission spectra for Example 5.

A single pass coating of infrared absorber ink was applied to both sides of the PVC inner layer. The visible tint to the card was decreased, but the infrared blocking was borderline for meeting the infrared specification. See FIG. 10.
Oberthur IR Spectrometer Readout—6.3

Example 6

Silk Screen Ink (40% Phosphor Loading/Absorber Ratio 5.5:1:1)

Figure 11:
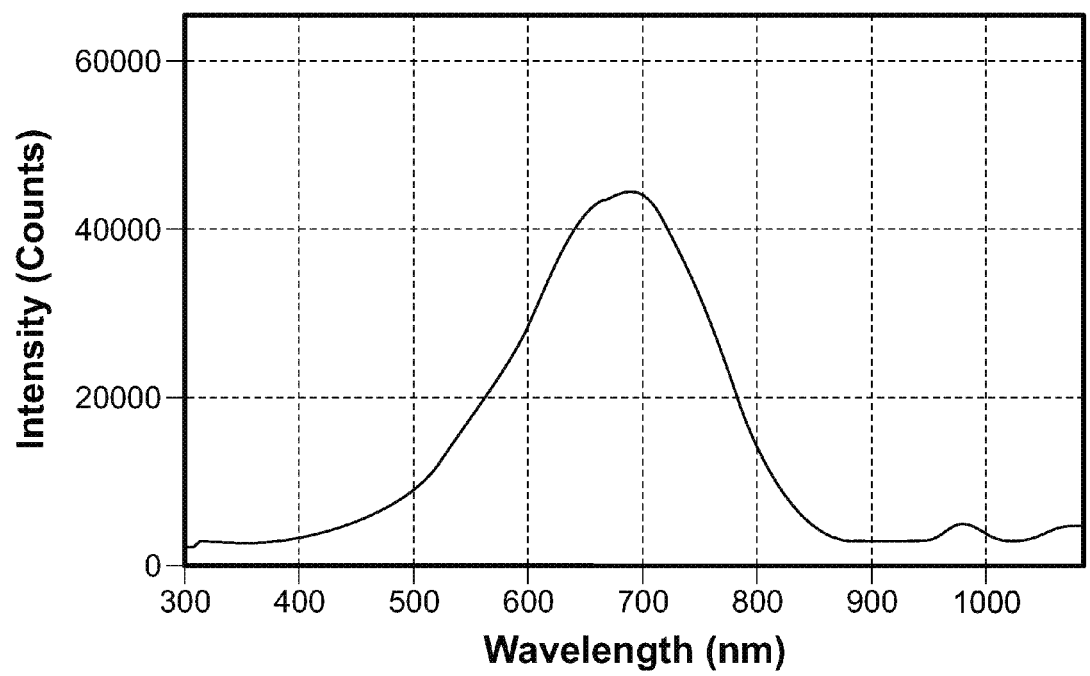
FIG. 11 shows the visible and IR transmission spectra for Example 6.

A single pass coating of infrared absorber ink was applied to the PVC inner layer. The visible tint to the card was decreased substantially but the infrared blocking fell below the acceptable limit. See FIG. 11.
Oberthur IR Spectrometer Readout—6.4

Example 7

Silk Screen Ink (30% Phosphor Loading/Absorber Ratio 5.5:1:1)

Figure 12:
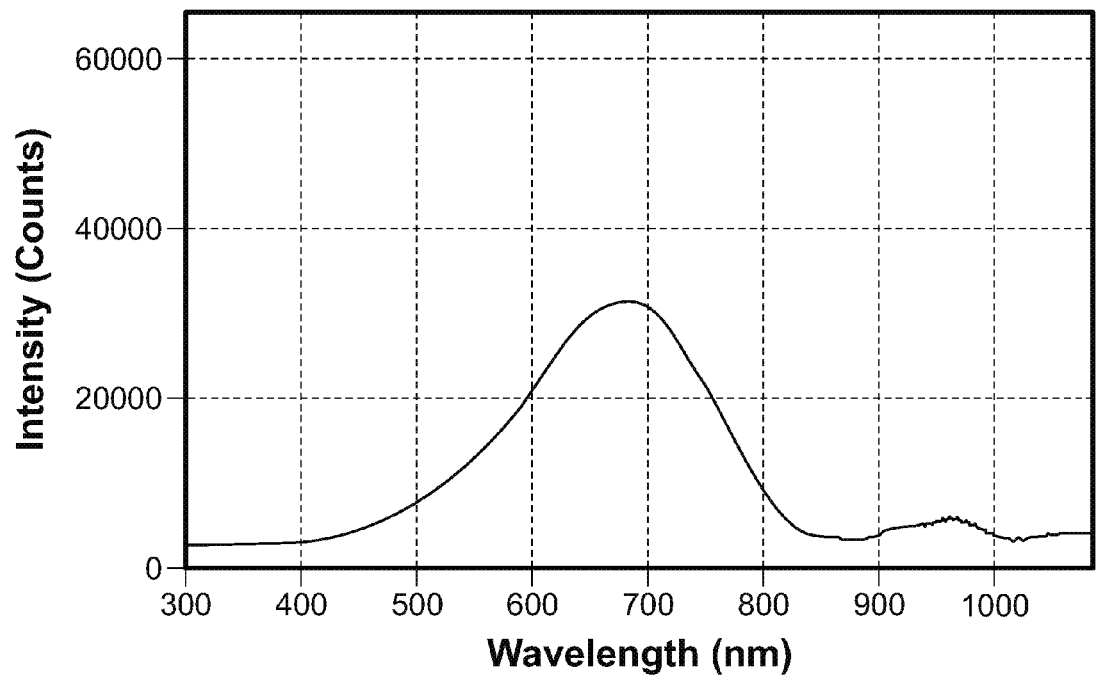
FIG. 12 shows the visible and IR transmission spectra for Example 7.

A single layer of infrared absorber was applied to both sides of the inner PVC layer. An increase in infrared blocking and slight decrease in visible transparency was observed. See FIG. 12.
Oberthur IR Spectrometer Readout—5.4

Example 8

Silk Screen Ink (30% Phosphor Loading/Absorber Ratio 4:1:1)

Figure 13:
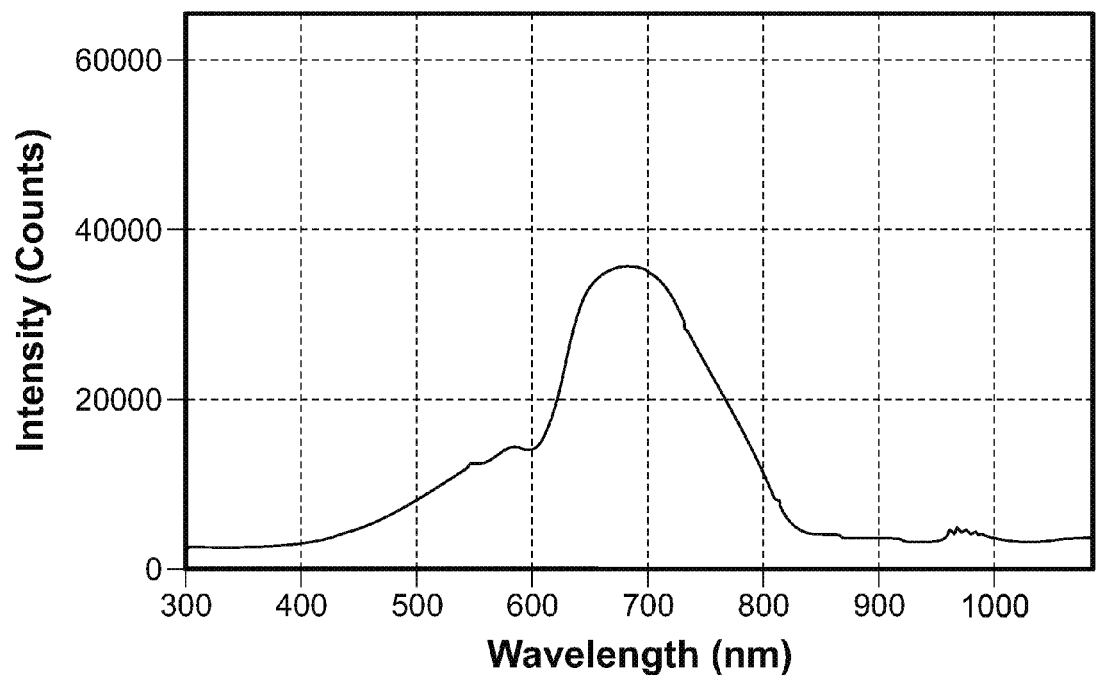
FIG. 13 shows the visible and IR transmission spectra for Example 8.

Three coatings of infrared absorber ink were incorporated into the card stack, two inner layer PVC films were utilized, one with both sides coated and a single coating on a second PVC film. There was an increase in infrared blocking to the required specifications; however, the cards possessed a cloudy appearance due to the triple coatings. See FIG. 13.
Oberthur IR Spectrometer Readout—4.6

Example 9

Silk Screen Ink (20% Phosphor Loading/Absorber Ratio 5.5:1:1)

Figure 14:
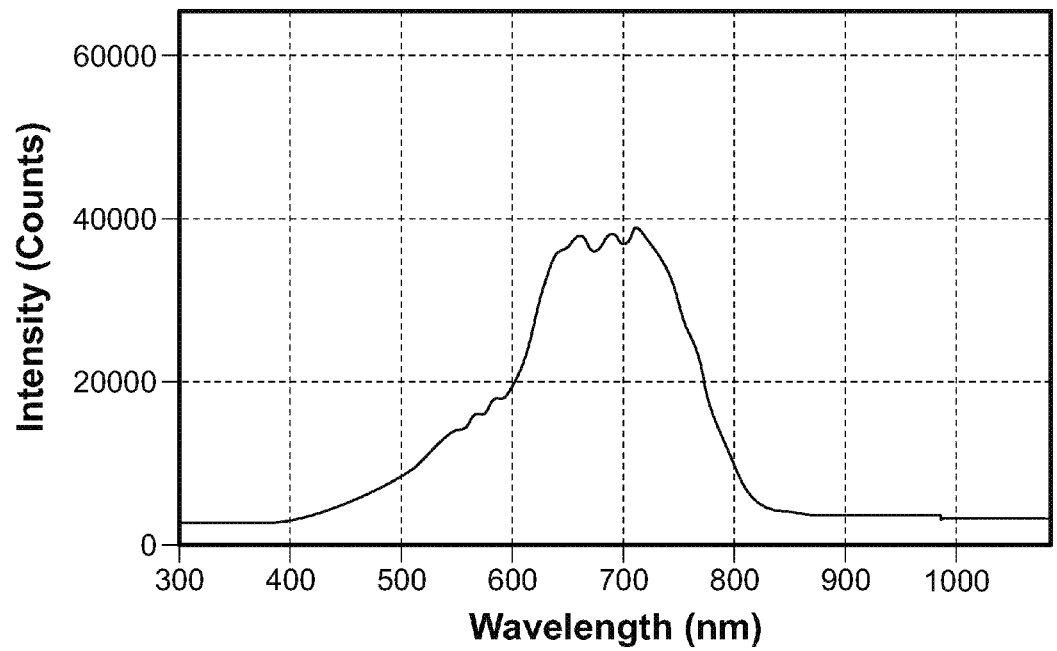
FIG. 14 shows the visible and IR transmission spectra for Example 9.

A layer of infrared absorber was applied to both sides of the inner PVC layer. Overall improvement in both the infrared blocking as well as the transparency of the card was observed; however, a blue tint was still present. See FIG. 14.
Oberthur IR Spectrometer Readout—4.6

Example 10

Silk Screen Ink (40% Phosphor Loading/Absorber Ratio 5.5:1)

Figure 15:
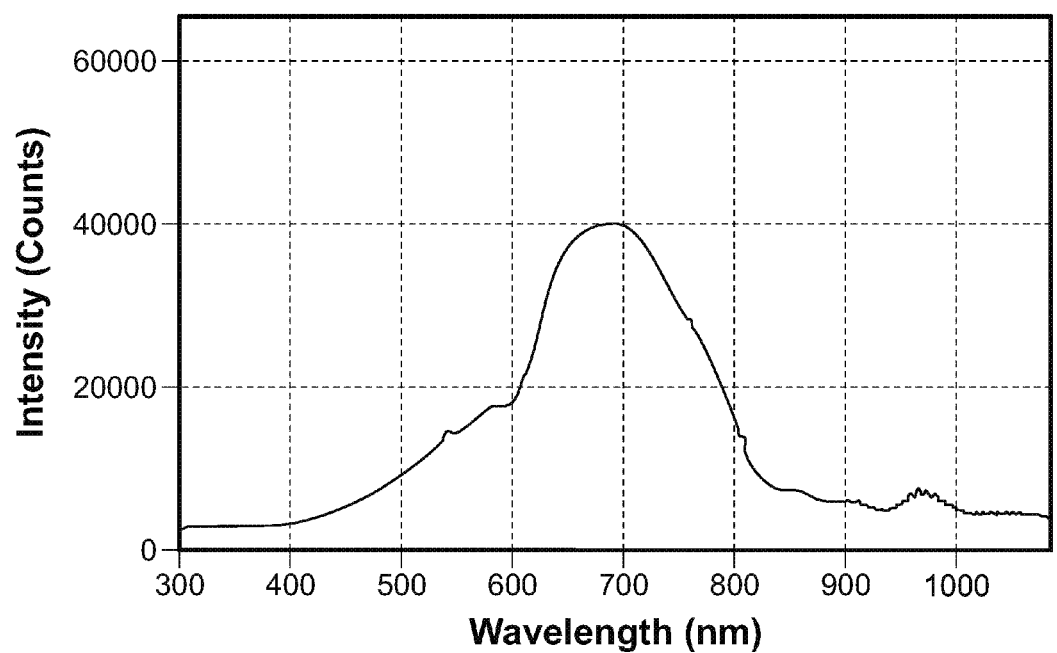
FIG. 15 shows the visible and IR transmission spectra for Example 10.

Increased concentration of the Phosphor based absorber in silkscreen ink by 10% and included 10% doping of additional RE compounds (Ytterbium, Samarium) for total IR blocker concentration of 40%. A layer of infrared absorber was applied to both sides of the inner PVC layer. There was a slight improvement in infrared blocking; however, the transparency in the visible region was degraded. See FIG. 15.
Oberthur IR Spectrometer Readout—2.7

Example 11

Silk Screen Ink (40% Phosphor Loading/Absorber Ratio 4.5:1:1)

Figure 16:
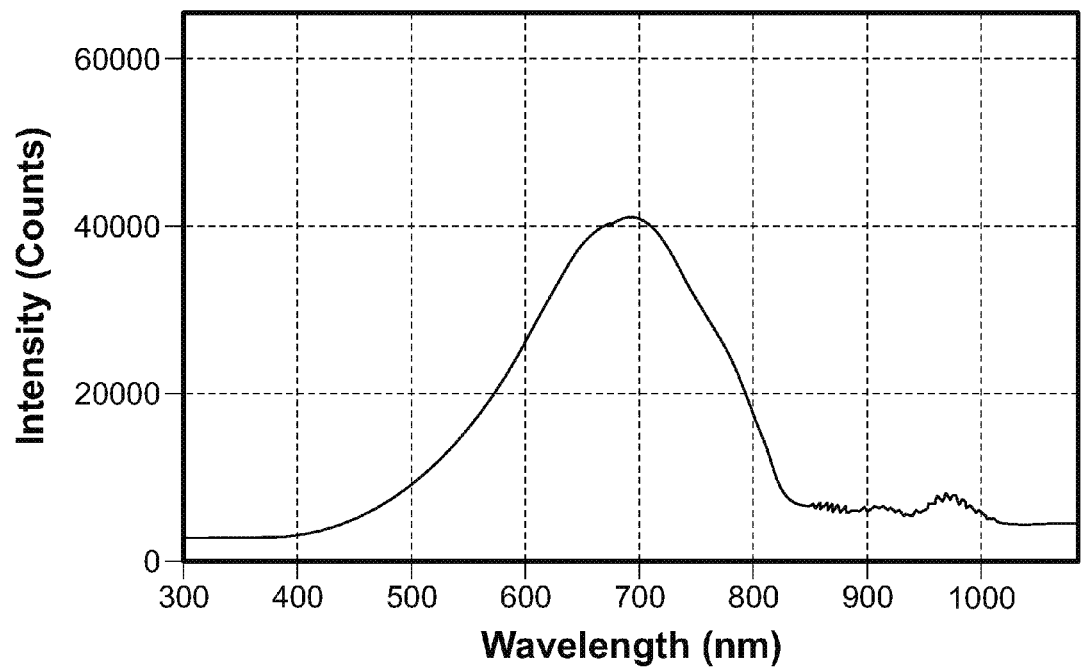
FIG. 16 shows the visible and IR transmission spectra for Example 11.

Increased concentration of the RE absorber in silk screen ink by 10% and increased Ytterbium Phosphor absorbers by 10% from previous run. A layer of infrared absorber was applied to both sides of the inner PVC layer. An overall improvement in both the infrared blocking as well as the transparency of the card meeting the ISO specifications for infrared blocking and visible transparency was observed. See FIG. 16.
Oberthur IR Spectrometer Readout—4.5

IR Blocking Film and Ink

Example 12

Silk Screen Ink (20% Phosphor Loading/Absorber Ratio 5.5:1:1)+Niobium/Tantalum IR-Blockers Vapor Deposited on PET Film A second and separate thin film layer of Nb/Ta absorbers vapor deposited on PET film was added into the card stack. A layer of infrared absorber phosphor-based ink was applied to both sides of the inner PVC layer. There was a slight decrease in infrared blocking from previous run; however, the overall transparency in the visible region clearly met specification.
Oberthur IR Spectrometer Readout—6.2

Example 13

Silk Screen Ink (20% Phosphor Loading/Absorber Ratio 5.5:1)+Niobium/Tantalum IR-Blockers Vapor Deposited on PET Film Two thin films of Nb/Ta absorbers vapor deposited on PET film were added into the card stack. A separate coating of infrared absorber phosphor-based ink was applied to one side of the inner PVC layer. Cards did not laminate and no bonding was observed. An additional layer of outer laminate with adhesive was required to utilize the two sheets of Nb/Ta PET film.
Oberthur IR Spectrometer Readout—6.0

Example 14

Silk Screen Ink (20% Phosphor Loading/Absorber Ratio 5.5:1:1)+Niobium/Tantalum IR-Blockers Vapor Deposited on PET Film Two thin films of Nb/Ta absorbers vapor deposited on PET film were added into the card stack with adhesive on both sides of the two films. The A layer of infrared absorber phosphor-based ink was applied to both sides of the inner PVC layer. Bonding was successful and cards passed required bond tests. An additional layer of outer laminate with adhesive was incorporated into the card stack on opposite sides of the PET layer. Infrared blocking specifications were achieved. The transparency was of acceptable tinting, but further optimization was performed to enhance the transparency.
Oberthur IR Spectrometer Readout—5.9

Example 15

Silk Screen Ink (10% Phosphor Loading/Absorber Ratio 7:1:1)+Niobium/Tantalum IR-Blockers Vapor Deposited on PET Film Two thin films of Nb/Ta absorbers vapor deposited on PET film were added into the card stack with adhesive on both sides of the two films. A layer of infrared absorber phosphor-based ink at 10% was applied to one side of the inner PVC layer. Bonding was successful and cards passed required bond tests. An additional layer of outer laminate with adhesive was incorporated into the card stack on opposite sides of the PET layer. Infrared blocking specifications were achieved and the transparency in the visible regions met specifications.
Oberthur IR Spectrometer Readout—6.0

Example 16

Silk Screen Ink (20% Phosphor Loading/Absorber Ratio 5.5:1:1)+Niobium/Tantalum IR-Blockers Vapor Deposited on PET Film Two thin films of Nb/Ta absorbers vapor deposited on PET film were added into the card stack with adhesive on both sides of the two films. A layer of infrared absorber phosphor-based ink was applied to both sides of the inner PVC layer. Bonding was successful and cards passed required bond tests. An additional layer of outer laminate with adhesive was incorporated into the card stack on opposite sides of the PET layer. Infrared blocking specifications were acceptable; however, the tinting still needed to be decreased.
Oberthur IR Spectrometer Readout—5.4

Example 17

Silk Screen Ink (20% Phosphor Loading/Absorber Ratio 5.5:1:1)+Niobium/Tantalum IR-Blockers Vapor Deposited on PVC Film Two thin films of Nb/Ta absorbers vapor deposited on PVC film were added into the card stack with adhesive on both sides of the two films. A layer of infrared absorber phosphor-based ink was applied to both sides of the inner PVC layer.

Figure 17:
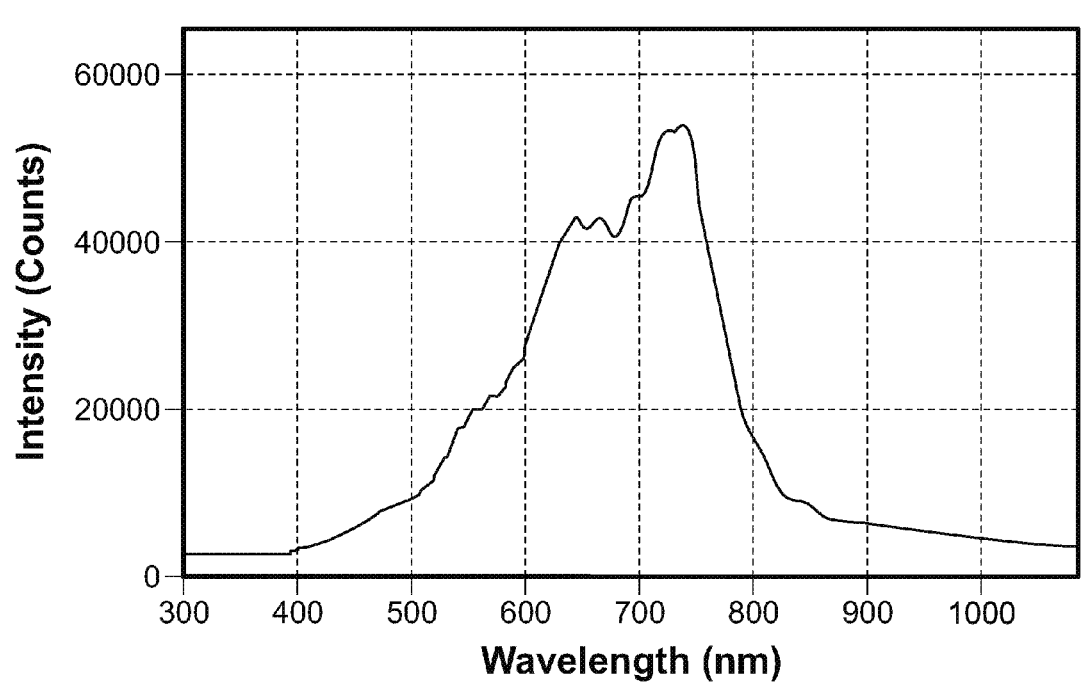
FIG. 17 shows the visible and IR transmission spectra for Example 17.

Bonding was successful and cards passed required bond tests. An additional layer of outer laminate with adhesive was incorporated into the card stack on opposite sides of the PVC layer. Infrared blocking specifications were below specification. See FIG. 17.

Oberthur IR Spectrometer Readout—8.0

Example 18

Silk Screen Ink (20% Phosphor Loading/Absorber Ratio 5.5:1:1)+Niobium/Tantalum IR-Blockers Vapor Deposited on PET Film Two thin films of Nb/Ta absorbers vapor deposited on PET film were added into the card stack with adhesive on both sides of the two films. A layer of infrared absorber phosphor-based ink was applied to both sides of the inner PVC layer. Bonding was successful and cards passed required bond tests. An additional layer of outer laminate with adhesive was incorporated into the card stack on opposite sides of the PVC layer. Infrared blocking specifications were below specification.

Oberthur IR Spectrometer Readout—6.0

The present invention has been described above with reference to exemplary embodiments. However, those skilled in the art having read this disclosure will recognize that changes and modifications may be made to the exemplary embodiments without departing from the scope of the present invention. These and other changes or modifications are intended to be included within the scope of the present invention, as expressed in the following claims.

The claimed invention is:

1. A transaction card comprising:
    a card body adapted to substantially transmit radiation in a visible light wavelength region;
    said card body comprising an optically recognizable material selected from at least one of an infrared ink and/or an infrared film,
    wherein said at least one infrared ink comprises at least one infrared blocking dye and the same or different nanoparticles,
    wherein said at least one infrared film comprises the same or different nanoparticles and other metal oxide and/or non-oxide complexes sputtered on a substrate,
    wherein said at least one infrared ink and said at least one infrared film block transmission of incident infrared radiation, and
  wherein said same or different nanoparticles comprise a plurality of monodisperse particles having:
    a single pure crystalline phase of a rare earth-containing lattice,
    a uniform three-dimensional size, and
    a uniform polyhedral morphology.

2. The transaction card of claim 1, wherein said at least one infrared blocking dye is selected from pthalocyanine dyes, benz[e]indol cyanines, dibutyl amino thpenyl benzenes, and hexa antimonte dyes, and mixtures thereof.

3. The transaction card of claim 1, wherein said at least one infrared blocking dye has infrared absorption peaks ranging from about 800-1000 nm.

4. The transaction card of claim 1, wherein said same or different nanoparticles of said at least one infrared ink are selected from rare earth nanophosphors.

5. The transaction card of claim 4, wherein said rare earth nanophosphors are selected from $LaF_3$, $CeF_3$, $NdF_3$, $PmF_3$, $SmF_3$, $GdF_3$, $YbF_3$ $LuF_3$, $NaGdF_3$, $Gd_2OS_2$, CeO, GdOCl, $Y_2O_3$, $Y_2O_2S$:Sm, $Y_2O_2S$:Yb, $YVO_4$, $Y,Gd_2$:$O_3$:Mg, $Y_2O_3$:Nd,Ho, $Sr_2S$:Sm,Er, $Gd_2O_3$:Yb, and $NaYF_4$:NdTm, and mixtures thereof.

6. The transaction card of claim 1, wherein said at least one infrared blocking dye further comprises other metal oxide and/or non-oxide complexes.

7. The transaction card of claim 1, wherein said same or different nanoparticles of said at least one infrared film is selected from rare earth nanophosphors.

8. The transaction card of claim 7, wherein said rare earth nanophosphors are selected from $LaF_3$, $CeF_3$, $NdF_3$, $PmF_3$, $SmF_3$, $GdF_3$, $YbF_3$ $LuF_3$, $NaGdF_3$, $Gd_2OS_2$, CeO, GdOCl, $Y_2O_3$, $Y_2O_2S$:Sm, $Y_2O_2S$:Yb, $YVO_4$, $Y,Gd_2$:$O_3$:Mg, $Y_2O_3$:Nd,Ho, $Sr_2S$:Sm,Er, $Gd_2O_3$:Yb, and $NaYF_4$:NdTm, and mixtures thereof.

9. The transaction card of claim 1, wherein said metal oxide and non-oxide complexes are selected from silicon dioxide, strontium titanate, yttrium oxide, magnesium oxide, copper oxide, CaS, $LiNbO_3$, SrS, $SrTiO_3$, gadolinium oxide, lithium niobate, sodium yttrium fluoride, neodymium oxide, ytterbium oxide, vanadates, fluorides, chlorides, and garnets, and mixtures thereof.

10. The transaction card of claim 1, wherein said at least one infrared film further comprises at least one dopant.

11. The transaction card of claim 10, wherein said at least one dopant is selected from niobium pentoxide, silicon dioxide, and gadolinium/yttrium/strontium oxide particles activated with either neodymium, magnesium, holmium, erbium, and samarium, and mixtures thereof.

12. The transaction card of claim 1, wherein said card has an optical density less than 0.5 between about 450-750 nm, an optical density greater than 1.3 between about 775-950 nm, and an optical density greater than 1.1 between about 950-1000 nm.

13. The transaction card of claim 1, wherein said card has a chromaticity distance of less than 0.005 from the color of a while-light source.

14. The transaction card of claim 1, wherein said at least one infrared ink, said at least one infrared film, or mixtures thereof further comprises at least one binder.

15. The transaction card of claim 1, wherein said infrared blocking dye and nanoparticle is present in said at least one infrared ink in an amount ranging from about 0.25%-25.0% by weight.

16. The transaction card of claim 1, wherein said substrate is a polyethylene substrate.

17. A method for making a transaction card, comprising:
    forming a core of transparent plastic;
    applying a plurality of coats of at least one infrared ink, at least one infrared blocking film, or mixtures thereof to at least one surface of the core;
    wherein said at least one infrared ink comprises at least one infrared blocking dye and the same or different nanoparticles,
    wherein said at least one infrared film comprises the same or different nanoparticles and other metal oxide and/or non-oxide complexes,
  wherein said at least one infrared ink and said at least one infrared film block transmission of incident infrared radiation, and
  wherein said same or different nanoparticles comprise a plurality of monodisperse particles having:
    a single pure crystalline phase of a rare earth-containing lattice,
    a uniform three-dimensional size, and
    a uniform polyhedral morphology.

18. The method of claim 17, wherein said plurality of coats is applied by sputtering on a substrate.

* * * * *